United States Patent
Ohmi

(10) Patent No.: US 7,491,656 B2
(45) Date of Patent: Feb. 17, 2009

(54) SEMICONDUCTOR DEVICE, METHOD FOR FORMING SILICON OXIDE FILM, AND APPARATUS FOR FORMING SILICON OXIDE FILM

(75) Inventor: Tadahiro Ohmi, Miyagi (JP)

(73) Assignee: Foundation for Advancement of International Science, Ibaraki Prefecture (JP)

(*) Notice: Subject to any disclaimer, the term of this patent is extended or adjusted under 35 U.S.C. 154(b) by 0 days.

(21) Appl. No.: 10/943,841

(22) Filed: Sep. 20, 2004

(65) Prior Publication Data
US 2005/0035425 A1 Feb. 17, 2005

Related U.S. Application Data

(62) Division of application No. 10/700,466, filed on Nov. 5, 2003, now Pat. No. 7,268,404, which is a division of application No. 09/787,435, filed as application No. PCT/JP00/04972 on Jul. 26, 2000, now Pat. No. 6,677,648.

(30) Foreign Application Priority Data

Jul. 26, 1999 (JP) ................................. 11-241983
Nov. 25, 1999 (JP) ................................. 11-375973

(51) Int. Cl.
*H01L 21/31* (2006.01)
(52) U.S. Cl. .................. 438/788; 438/770; 438/771; 438/787; 257/E21.269; 257/E21.278
(58) Field of Classification Search ............. 438/771, 438/765, 772; 257/E21.282, E21.283
See application file for complete search history.

(56) References Cited

U.S. PATENT DOCUMENTS 4,027,320 A 5/1977 Jacobs et al. ............... 257/290
5,889,304 A 3/1999 Watanabe et al. .......... 257/321

(Continued)

FOREIGN PATENT DOCUMENTS

JP 02-148844 A 6/1990

(Continued)

OTHER PUBLICATIONS

Hirayama et al., "Low-Temperature Growth of High-Integrity Silicon Oxide Films by Oxygen Radical Generated in High-Density Krypton Plasma", IEDM Tech. Dig., pp. 249-252, 1999.*

*Primary Examiner*—Walter L Lindsay, Jr.
*Assistant Examiner*—Cheung Lee
(74) *Attorney, Agent, or Firm*—Arent Fox LLP

(57) ABSTRACT

A silicon oxide film (1701) serving as a gate insulating film of a semiconductor device contains Kr. Therefore, the stress in the silicon oxide film (1701) and the stress at the interface between silicon and the silicon oxide film are relaxed, and the silicon oxide film has a high quality even though it was formed at a low temperature. The uniformity of thickness of the silicon oxide film (1701) on the silicon of the side wall of a groove (recess) in the element isolating region is 30% or less. Consequently, the silicon oxide film (1701) has its characteristics and reliability superior to those of a silicon thermal oxide film, and the element isolating region can be made small, thereby realizing a high-performance transistor integrated circuit preferably adaptable to an SOI transistor and a TFT.

5 Claims, 30 Drawing Sheets

U.S. PATENT DOCUMENTS 6,497,783 B1 * 12/2002 Suzuki et al. .......... 156/345.34
6,635,589 B2 * 10/2003 Yamazaki et al. ............ 438/798
2003/0003243 A1 * 1/2003 Ueno ........................ 427/569

FOREIGN PATENT DOCUMENTS

| | | |
|---|---|---|
| JP | 7-094578 | 4/1995 |
| JP | 7-094578 A | 4/1995 |
| JP | 2000-091589 A | 3/2000 |
| JP | 2000-260767 A | 9/2000 |
| JP | 2000-286260 A | 10/2000 |
| KR | 1998-068811 | 10/1998 |
| WO | 98/33362 | 7/1998 |

* cited by examiner

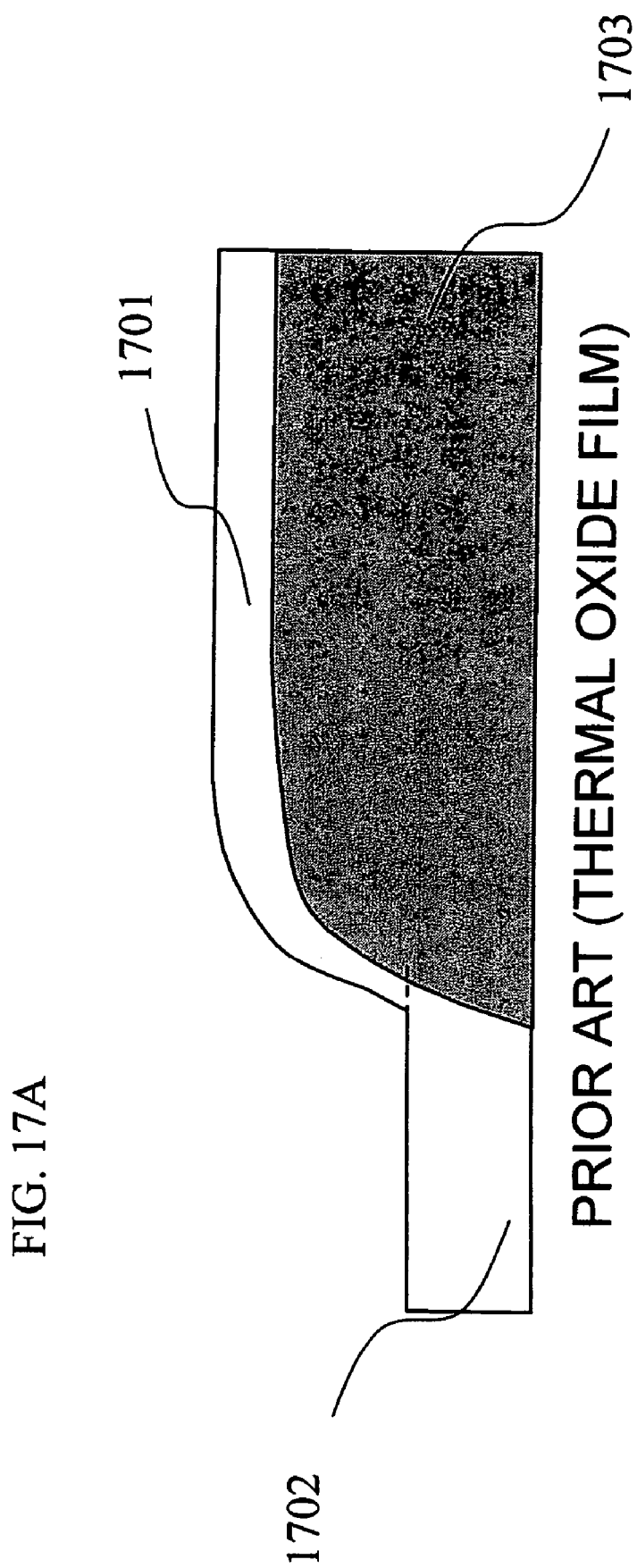
FIG. 17A    PRIOR ART (THERMAL OXIDE FILM)

CONVENTIONAL DEVICE STRUCTURE

IMPROVED DEVICE STRUCTURE

SEMICONDUCTOR DEVICE, METHOD FOR FORMING SILICON OXIDE FILM, AND APPARATUS FOR FORMING SILICON OXIDE FILM

This is a Divisional of application Ser. No. 10/700,466 filed Nov. 5, 2003, which is a Divisional of application Ser. No. 09/787,435 filed Mar. 26, 2001, which in turn is a 371of PCT/JP00/04972 filed Jul. 26, 2000. The disclosure of the prior applications are hereby incorporated by reference herein in their entirety.

TECHNICAL FIELD

The present invention relates to semiconductor devices using silicon oxide films and methods for forming silicon oxide films, particularly to semiconductor devices using very thin silicon oxide films, semiconductor devices including element isolation structures in which a dielectric substance is buried in silicon, semiconductor devices including element isolation structures formed on an insulating film, and methods and apparatus for forming silicon oxide films.

BACKGROUND ART

The gate insulating films of transistors formed on silicon substrates require high performance characteristics such as low interface level density, and high reliability such as high withstand voltage and high hot carrier tolerance. As a conventional oxide film formation technique to meet those requirements, thermal oxidation at 800° C. or more has been used.

Besides, from a demand for forming transistors on a silicon semiconductor at higher density, for transistor integrated elements formed on a silicon substrate, in concert with the progress of scale-down technique, in place of selective oxidation film (LOCOS) element isolation structures in which bird's beaks extend, element isolation structures such as shallow trench isolation that enables narrow dielectric isolation came to be used.

Besides, for integrated elements such as SOI (Silicon On Insulator) transistors and polysilicon transistors formed on an insulating film, used were element isolation structures in which silicon films are formed into islands by LOCOS isolation with silicon oxide films and mesa isolation by etching silicon off.

For formation of semiconductor elements with ultrahigh integration/ultrahigh speed drive, however, conventional thermal oxidation can not be used. To realize ultrahigh speed elements, a metallic material must be introduced in the semiconductor device. But, if a high temperature process at 550° C. or more is used, the metal can react with the semiconductor to deteriorate the operation performance of the elements. Besides, if such a high temperature process is used, it becomes difficult to form an accurate impurity distribution because of rediffusion of impurities. This makes it hard to form ultrahigh integrated elements. Therefore, oxide film formation at a low temperature of 550° C. or less is indispensable.

So, in recent years, techniques for forming silicon oxide films at low temperatures have been studied. But, characteristics of a silicon oxide film formed at 550° C. or less were never equal to those of a thermal oxide film. The oxidation speed of such conventional low-temperature oxidation is lower than that of thermal oxidation, so electrical characteristics, such as interface level density and current-voltage characteristic, of a silicon oxide film formed were greatly inferior to those of a thermal oxide film.

Besides, in a conventional element isolation structure for transistor integrated elements formed on a silicon substrate, the thickness of a silicon oxide film at a portion near a corner of an element isolation side wall portion is smaller than that on a flat silicon surface portion. Therefore, a problem arose that characteristics such as leakage current and withstand voltage of the oxide film are inferior at the thin portion and the reliability in performance of the elements are deteriorated. Further, since a parasitic transistor element having its thin gate oxide film exists in parallel with a transistor element having its gate oxide film of a normal thickness, this deteriorated the voltage-current characteristic of the transistor.

In order to solve such problems, if the thickness of the silicon oxide film is simply increased to avoid the problem that arises at the thin portion, since the silicon oxide film also serves as a gate oxide film, a problem arises that the drive performance of the MOS transistor deteriorates. So, conventionally, the angle of the side wall portion of the recessed portion in the element isolating region with the silicon surface is set at about 70 degrees or less so that thinning of the silicon oxide film at corners of the side wall portion is relieved. Even in this case, however, about 30% or more thinning occurred, and occurrence of characteristic deterioration such as leakage current and withstand voltage of the oxide film at the thin portion could not completely be prevented. Furthermore, formation of the recessed element isolating region with an obtuse angle brought about problems that the element isolation width increased, the ratio in area of the effective region where elements such as transistors are to be formed decreased, and high density integration could not be intended.

Furthermore, in a conventional element isolation structure for integrated elements such as SOI (Silicon On Insulator) transistors and polysilicon transistors formed on an insulating film, in case of LOCOS element isolation, a parasitic transistor element existed near the interface between the element isolation oxide film below a gate electrode and silicon. This deteriorated electrical characteristics of the transistor, in particular, subthreshold current characteristic and off-leak characteristic. On the other hand, in case of mesa element isolation, a high quality oxide film could not be formed on the element isolation side wall portion where silicon has been etched off. This had a bad influence on characteristics, in particular, off characteristics, of the transistor.

Accordingly, it is an object of the present invention to provide semiconductor devices, and methods and apparatus for forming silicon oxide films, which make it possible to realize silicon oxide films having, even though they were formed by low-temperature plasma oxidation, characteristics and reliability superior to those of silicon thermal oxide films formed at a high temperature of about 1000° C., and to realize high-performance transistor integrated circuits that can reduce the area of their element isolating regions and be suitably applied to SOI transistors and TFTs.

SUMMARY OF THE INVENTION

The present invention was made for solving those conventional problems, and a semiconductor device of the present invention includes a plurality of transistors with their substrate of silicon, and is characterized in that at least part of a silicon oxide film formed on a surface of said silicon contains Kr (krypton).

According to an aspect of the semiconductor device of the present invention, a recessed groove is formed at part of said substrate surface between said plurality of transistors, and a dielectric substance is formed in part of said groove, said silicon oxide film is formed on a corner of said substrate surface in said groove, and at least part of said silicon oxide film contains Kr.

According to an aspect of the semiconductor device of the present invention, a side wall portion in said groove is formed such that the angle of part of said side wall portion with said substrate surface exceeds at least 75 degrees.

According to an aspect of the semiconductor device of the present invention, the difference in thickness of said silicon oxide film between the portions formed on at least part of the surface other than said groove of said substrate and on at least part of the surface in said groove is within 30%.

A semiconductor device of the present invention wherein a semiconductor film at part of a surface of which a recessed groove is formed or an island-shape semiconductor film is formed on an insulating film, is characterized in that a silicon oxide film is formed on a corner of said semiconductor film of said groove or a corner of said semiconductor film, and at least part of said silicon oxide film contains Kr.

According to an aspect of the semiconductor device of the present invention, the content of Kr contained in said silicon oxide film decreases from said silicon oxide film surface toward a silicon/silicon oxide film interface.

According to an aspect of the semiconductor device of the present invention, the Kr content in said silicon oxide film is $5 \times 10^{11}$ cm$^{-2}$ or less at the surface density.

A method of the present invention for forming a silicon oxide film, is characterized by introducing a mixture gas mainly containing a gas containing oxygen and Kr gas into a process chamber, exciting plasma with a microwave, and directly oxidizing a silicon substrate surface placed in the process chamber, thereby forming a silicon oxide film on said silicon substrate surface.

According to an aspect of the method of the present invention for forming a silicon oxide film, said silicon oxide film is the gate insulating film of a transistor.

According to an aspect of the method of the present invention for forming a silicon oxide film, the oxygen partial pressure in said mixture gas is 2 to 4%, and the pressure in said process chamber is 800 mTorr (106 Pa) to 1.2 Torr (160 Pa).

According to an aspect of the method of the present invention for forming a silicon oxide film, said plasma is plasma excited with a microwave of a frequency of 900 MHz to 10 GHz.

An apparatus of the present invention for forming a silicon oxide film, is characterized by comprising a process chamber in which a silicon substrate is placed, and a waveguide tube for supplying a microwave in said process chamber, and in that a mixture gas mainly containing a gas containing oxygen and Kr gas is introduced into said process chamber, plasma is excited with the microwave, and said silicon substrate surface is directly oxidized, thereby forming a silicon oxide film on said silicon substrate surface.

A semiconductor device of the present invention includes a plurality of transistors each having its source and drain regions each comprising a high impurity concentration region, and is characterized in that at least part of the portion between said source and drain regions is a silicon oxide film containing Kr.

In the present invention, even though it was formed by low-temperature plasma oxidation, formation of a silicon oxide film having its characteristics and reliability superior to a silicon thermal oxide film formed at a high temperature of about 1000° C. becomes possible, and a high-performance transistor integrated circuit can be realized.

In the present invention, the thickness of the silicon oxide film at a portion near a corner of an element isolation side wall portion is never thinned, and it is substantially equal to the film thickness of the flat silicon surface portion. Therefore, characteristics of the oxide film such as leakage current and withstand voltage are good, and so an improvement of reliability of the element can be realized. Besides, since this silicon oxide film is usable even in a thinned state as a gate oxide film, both of an improvement of reliability of element isolation and an improvement of drive performance of a MOS transistor can be realized at once. Besides, even if the angle of the side wall portion of the recessed portion of the element isolating region of the silicon substrate with the silicon surface is set at about 75 degrees or more or 90 degrees, thinning of the silicon oxide film at a corner of the side wall portion does not occur, and so a narrow element isolating region can be formed, the ratio in area of the effective region for forming elements such as transistors increases, and high density integration can be realized.

Further, even in an element isolation structure for SOI (Silicon On Insulator) transistors or polysilicon transistors formed on an insulating film, a high-quality oxide film can be formed on the element isolation side wall portion, and, without any parasitic transistor existing, the electrical characteristics of each transistor can be good.

BRIEF DESCRIPTION OF THE DRAWINGS

FIGS. 17A and 17B are conceptional views showing a difference in coverage between gate insulating films when the shallow trench isolation structure is applied to a prior art (a case of thermal oxidation) and the present invention (oxidation with $Kr/O_2$ high density plasma);

DETAILED DESCRIPTION OF THE PREFERRED EMBODIMENTS

Hereinafter, specific embodiments to which the present invention is applied will be described in detail with reference to drawings.

Embodiment 1

Figure 1:
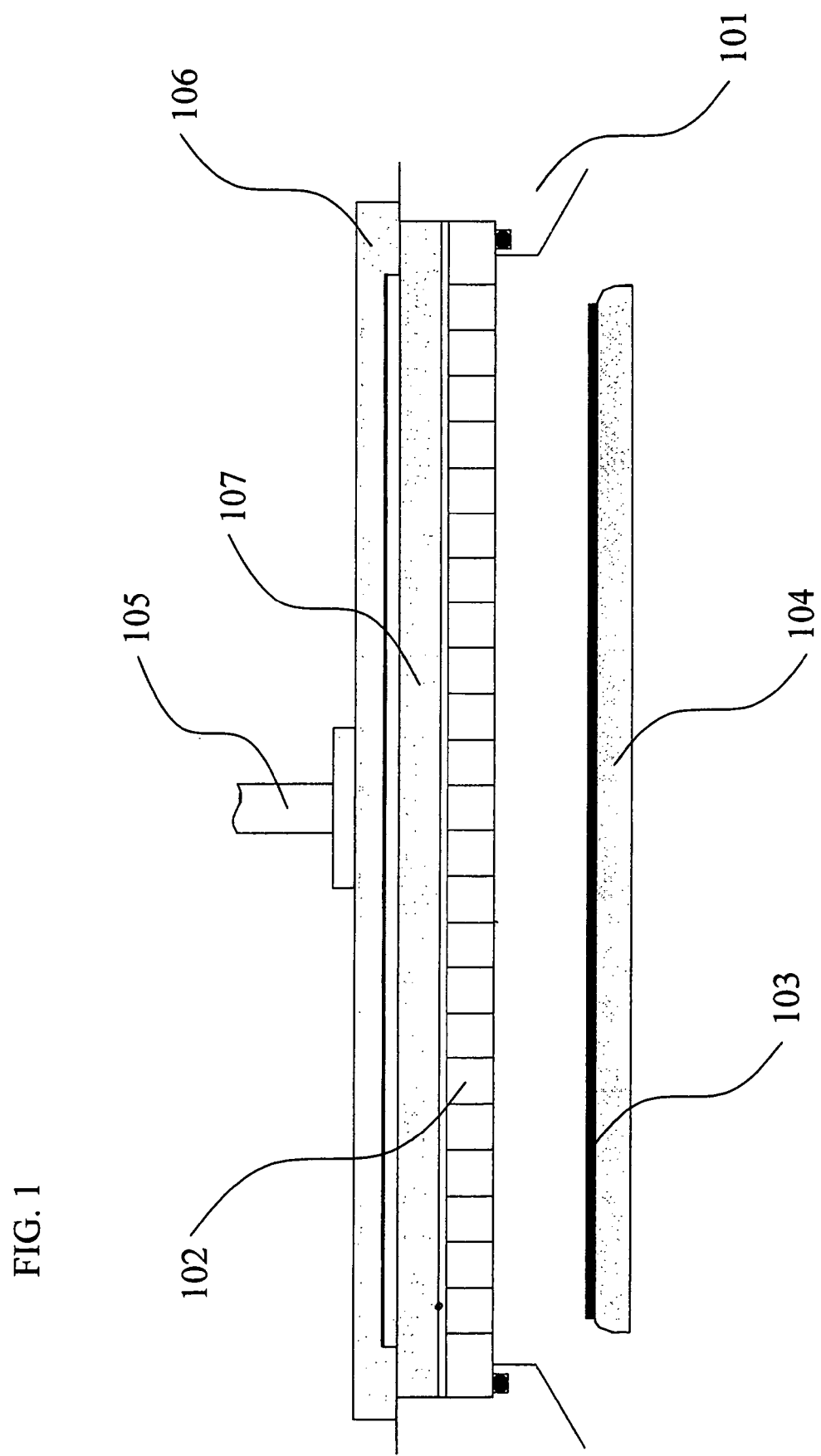
FIG. 1 is a conceptional view showing an example of apparatus using a radial line slot antenna for realizing a silicon oxide film formation method of the present invention.
Figure 2:
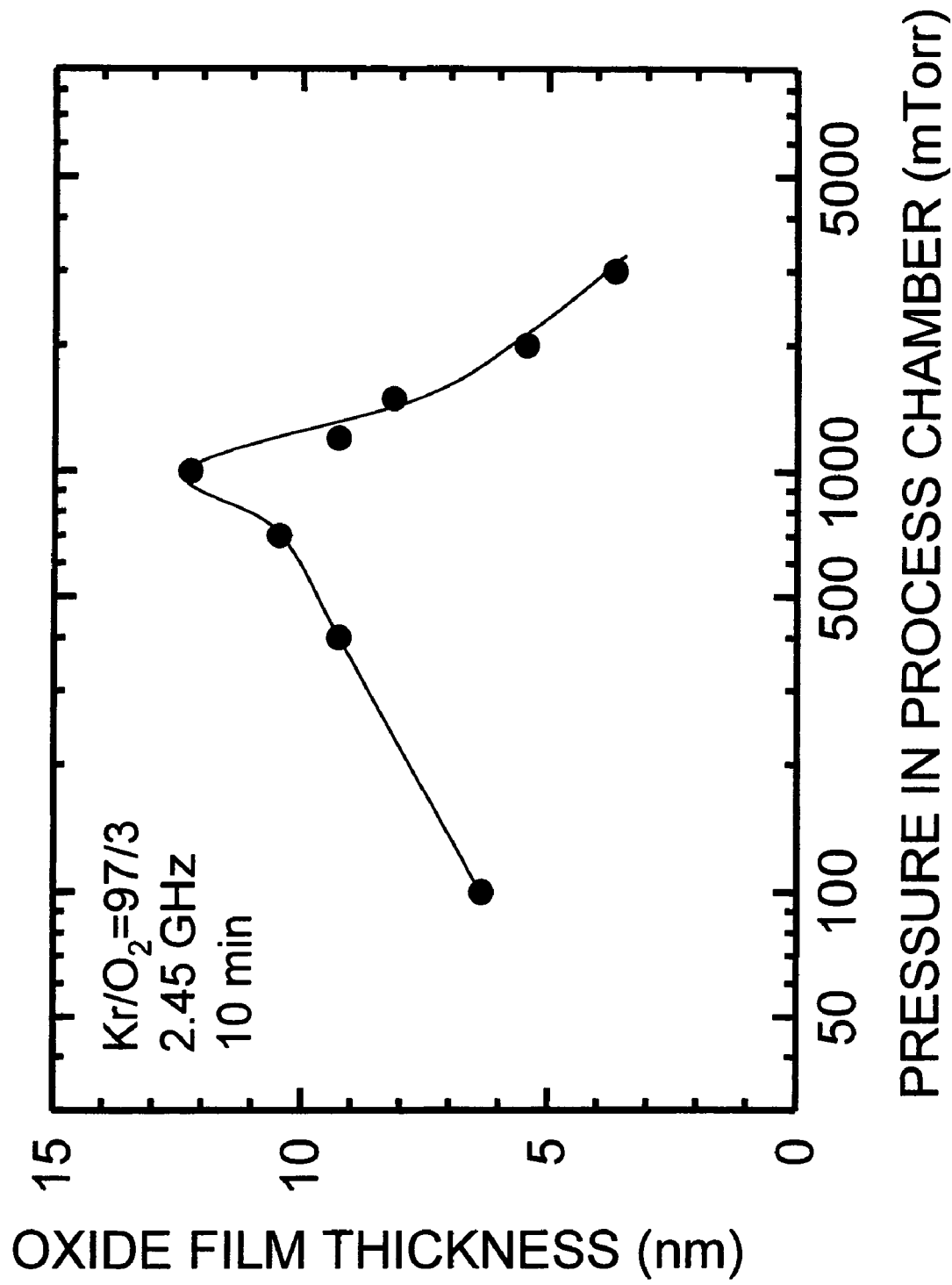
FIG. 2 is a graph showing the dependence of oxidation film thickness on process chamber gas pressure in a high density plasma oxidation process at a substrate temperature of 400° C., Kr/O$_2$=97/3, and 2.45 GHz for ten minutes.

Low-temperature oxide film formation using plasma will be described first. FIG. 1 is a sectional view showing an example of apparatus using a radial line slot antenna for realizing an oxidation method of the present invention (refer to Japanese Patent Application No. 9-133422).

The present invention has a novel characteristic feature wherein Kr is used in plasma-exciting gas. This apparatus is mainly effective for a circular substrate. A vacuum vessel (process chamber) 101 is made vacuous, Kr gas and $O_2$ gas are introduced through a shower plate 102, and, for example, the pressure in the process chamber is set at about 1 Torr (133 Pa). A circular substrate 103 such as a silicon wafer is placed on a sample table 104 with a heating system, and, for example, setting is made such that the temperature of the sample becomes 400° C. If this temperature setting is within the range of 200 to 500° C., the same result as that described below can be obtained. A microwave of 2.45 GHz is supplied from a coaxial waveguide tube 105 through a radial line slot antenna 106 and a dielectric plate 107 into the process chamber, and high density plasma is generated in the process chamber. The narrower this distance is, the more rapid the possible film formation is. Besides, if the frequency of the microwave supplied is within the range not less than 900 MHZ and not more than 10 GHz, the same result as that described below can be obtained. The distance between the shower plate 102 and the substrate 103 is set at 6 cm in this embodiment. Although an example wherein film formation was done using the plasma apparatus with the radial line slot antenna was shown in this embodiment, the microwave may be introduced into the process chamber using another method.

In the high density plasma of the mixture gas of Kr and $O_2$, Kr* in an intermediate excitation state collides with an $O_2$ molecule, and atomic oxygen O* is efficiently generated. With this atomic oxygen, the substrate surface is oxidized. Until now, for example, oxidation of silicon surfaces was made with $H_2O$ molecules or $O_2$ molecules, and the process temperatures were very high as 800 to 1100° C. However, oxidation with atomic oxygen is possible at a sufficiently low temperature. To increase opportunities of collision between Kr* and $O_2$, the higher process chamber pressure is desirable. But, if the pressure is too high, generated O* radicals collide with each other and return to an $O_2$ molecule. Of course, there is the optimum gas pressure. FIG. 1 shows the oxide film thickness that grows through an oxidation process at a silicon substrate temperature of 400° C. for ten minutes, when the gas pressure in the process chamber is changed while the pressure ratio in the process chamber is kept at 97% Kr/3% oxygen. When the gas pressure in the process chamber is 1 Torr (133 Pa), the oxide film becomes the thinnest. This pressure or its vicinity is optimal.

Figure 3:
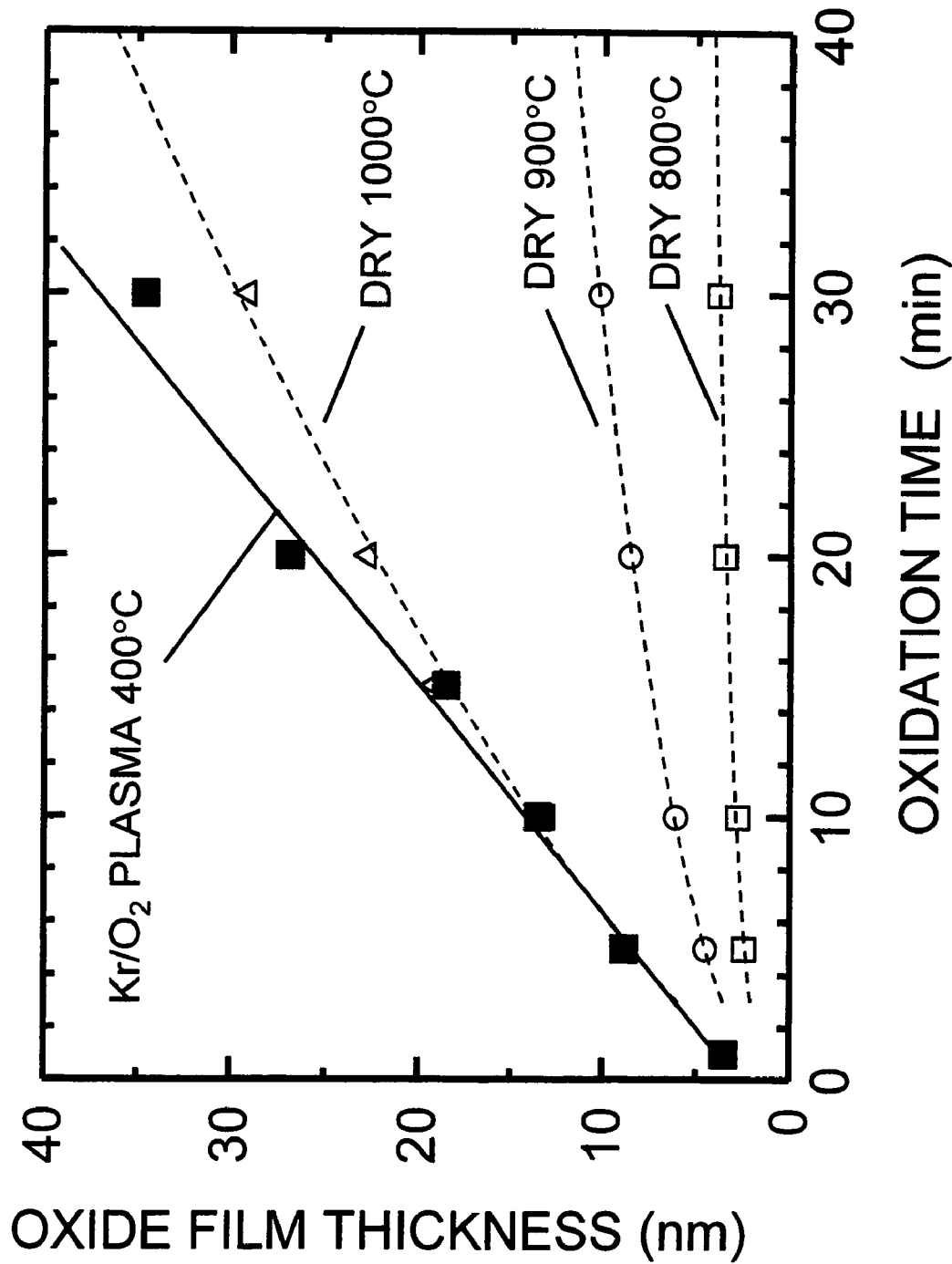
FIG. 3 is a graph showing the dependence of oxidation film thickness on oxidation time in a high density plasma oxidation process at a substrate temperature of 400° C., Kr/O$_2$=97/3, and 2.45 GHz, as well as dependence on oxidation time in conventional dry oxidation (at substrate temperatures of 800° C., 900° C., and 1000° C.)

FIG. 3 shows the relation between the oxide film thickness and the oxidation time upon silicon substrate surface oxidation using Kr/O$_2$ high density plasma. FIG. 3 also shows the dependence on the oxidation time in conventional dry oxidation, in relation to substrate temperatures 800° C., 900° C., and 1000° C. It is clear that the oxidation speed of the Kr/O$_2$ high density plasma oxidation when the substrate temperature is 400° C. and the pressure in the process chamber is 1 Torr (133 Pa) is higher than that of the atmospheric pressure dry O$_2$ oxidation when the substrate temperature is 1000° C. Introduction of silicon substrate surface oxidation using Kr/O$_2$ high density plasma considerably improves productivity of the surface oxidation technique.

Further, in a conventional high-temperature thermal oxidation technique, O$_2$ molecules or H$_2$O molecules pass through the oxide film formed on the surface, by diffusion. They reach the interface between silicon/silicon oxide film and contribute to oxidation. Thus it was common knowledge that the oxidation speed is greatly influenced by the diffusion speed of O$_2$ or H$_2$O molecules in the oxide film, and increases in proportion to $t^{1/2}$ with the oxidation time t.

In this case of Kr/O$_2$ high density plasma, however, the oxidation speed is linear till 35 nm of the oxide film thickness. This shows that atomic oxygen can freely pass through the silicon oxide film. Namely, it is clear that the diffusion speed is very high.

Figure 4:
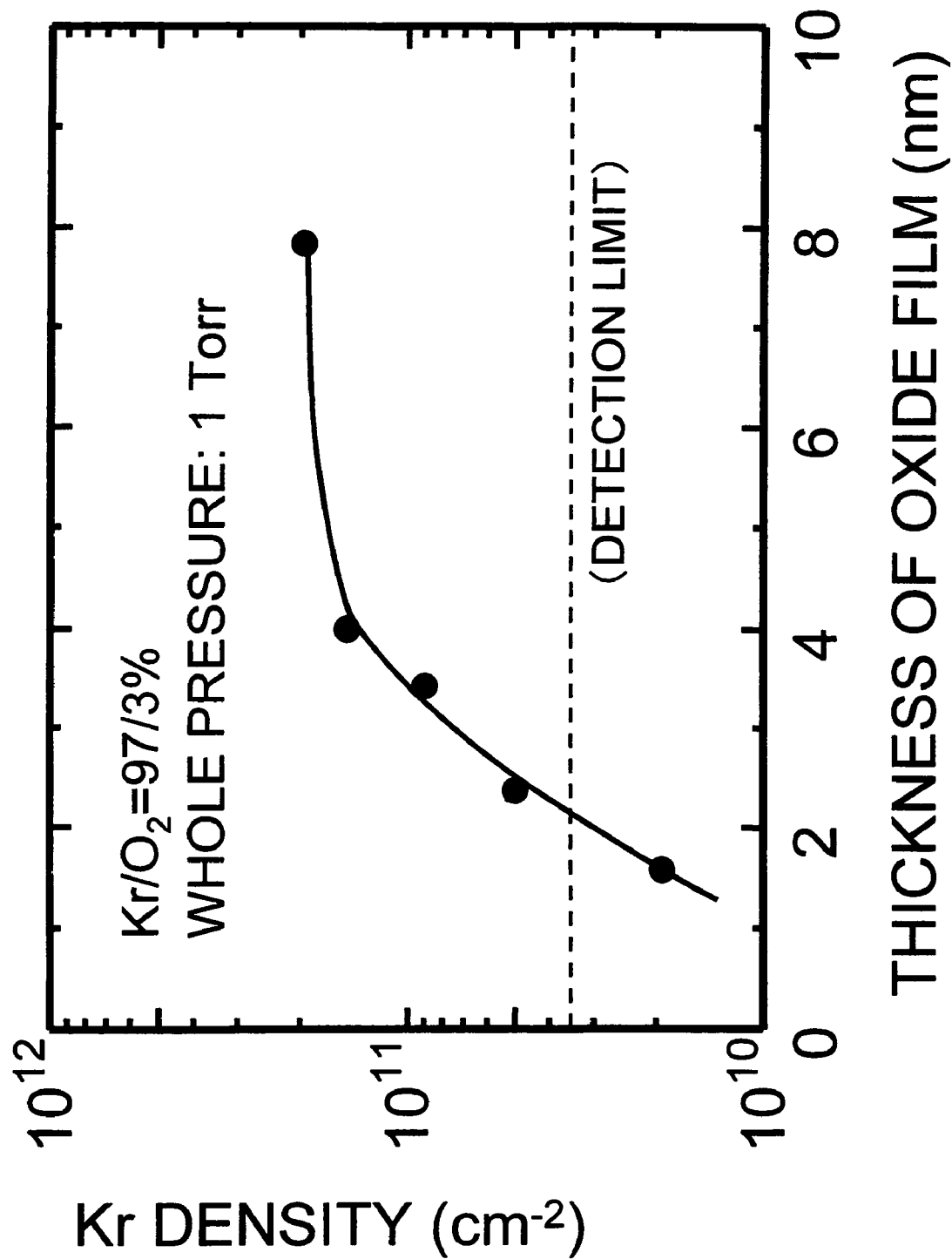
FIG. 4 is a graph showing the distribution along depth of Kr density in a silicon oxide film.

FIG. 4 shows a result of an examination in which the distribution along depth of the Kr density in a silicon oxide film formed through the above-described process was examined with a full-reflection fluorescence X-ray spectrometer. The examination was done under the conditions that the partial pressure of oxygen in Kr was 3%, the pressure in the process chamber was 1 Torr (133 Pa), and the substrate temperature was 400° C. The thinner the oxide film thickness is, the more the Kr density decreases. At the silicon oxide film surface, Kr exists at a density of about $2\times10^{11}$ cm$^{-2}$. That is, this silicon oxide film is a film in which the Kr concentration in the film of the thickness of 4 nm or more is constant and the Kr concentration decreases toward the interface between silicon/silicon oxide film.

Figure 5:
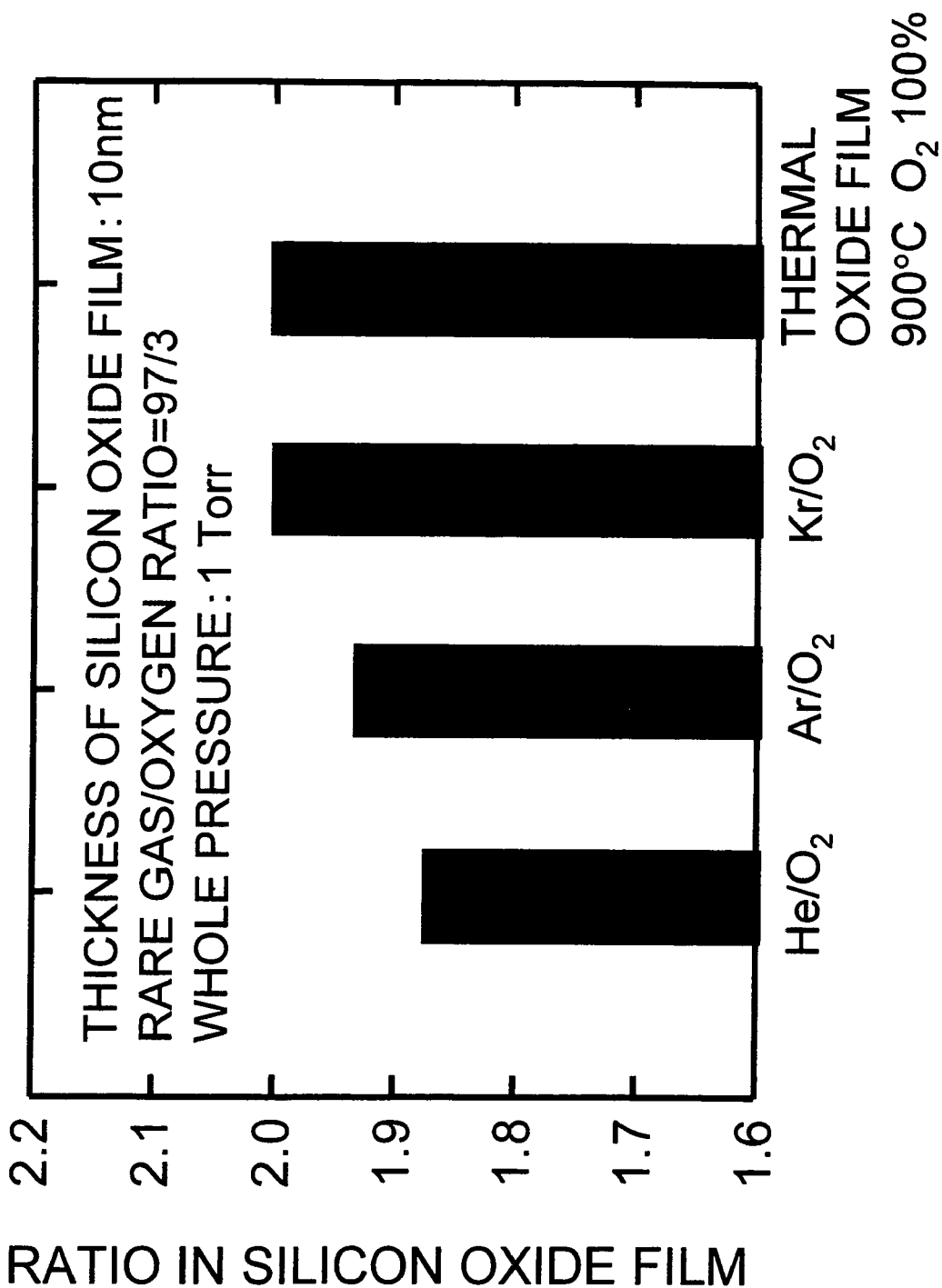
FIG. 5 is a graph showing kinds of rare gases used in silicon oxidation, and ratios in composition of oxygen to silicon in silicon oxide films obtained.

FIG. 5 shows kinds of rare gases (Kr, Ar, He) used in silicon oxide film growth, and a result of an examination in which the ratio in composition of oxygen to silicon in silicon oxide films obtained was examined with an X-ray photoelectron spectrometer. Formation of the silicon oxide films was done with the apparatus shown in FIG. 1 at a substrate temperature of 400° C. The partial pressure of oxygen in each rare gas and the pressure in the process chamber were fixed at 3% and 1 Torr (133 Pa), respectively. For comparison, the ratio in composition of oxygen to silicon in a thermal oxide film formed at a substrate temperature of 900° C. in the atmosphere of 100% oxygen is also shown. In case of using helium gas (He) or argon gas (Ar), the composition ratio of the silicon oxide film shows poorness of oxygen. Contrastingly, the silicon oxide film formed using Kr gas shows the ratio of oxygen to silicon equivalent to that of the thermal oxide film. We suspect this is because the excitation state of Kr very efficiently generates O* in comparison with He or Ar.

Figure 6:
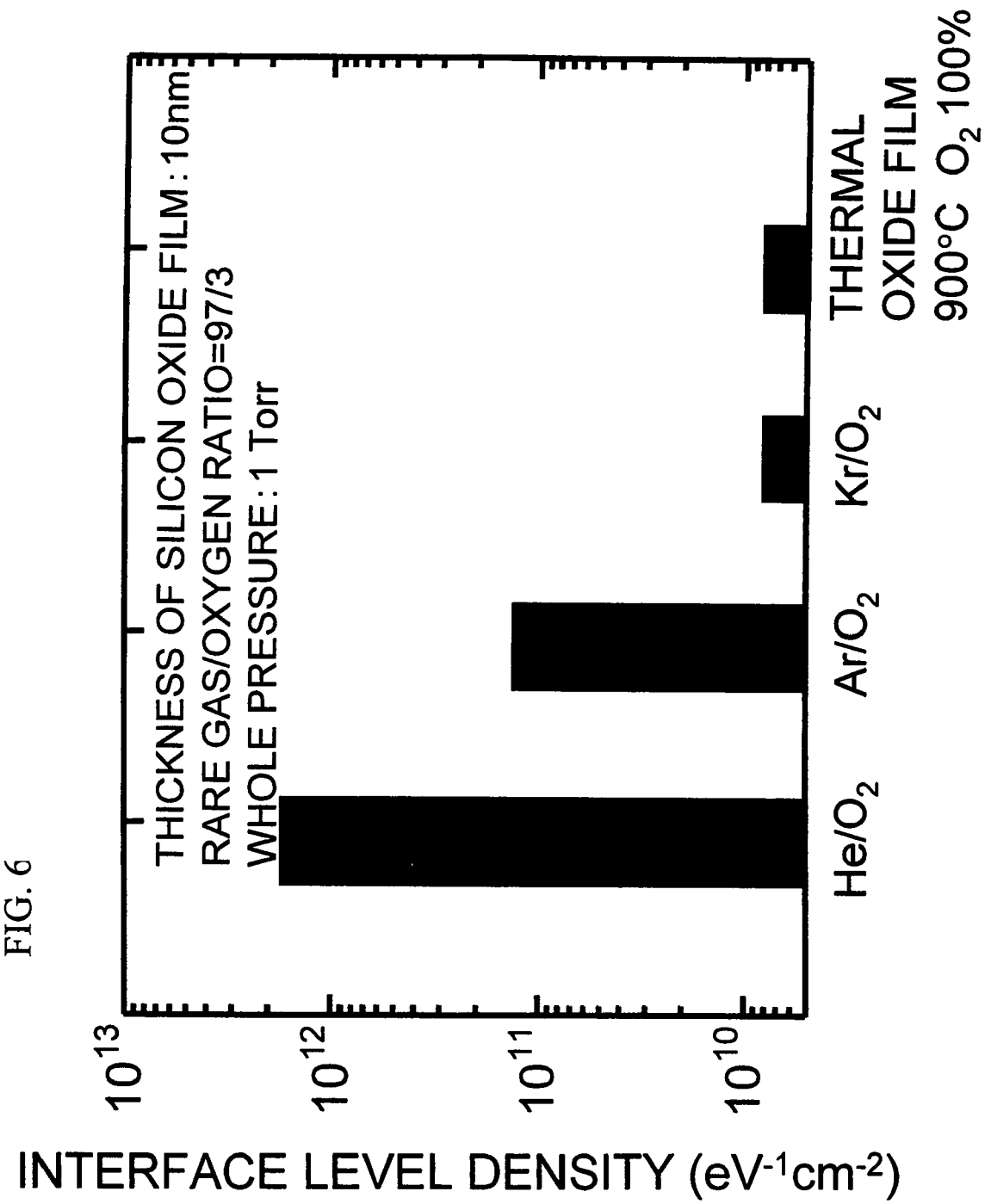
FIG. 6 is a graph showing kinds of rare gases used in growths of silicon oxide films, and a result of measurement of interface level densities of the silicon oxide films obtained.

FIG. 6 shows kinds of rare gases used in silicon oxide film growth, and a result of an examination in which the interface level density in silicon oxide -films obtained was examined through low-frequency C-V measurement. Formation of the silicon oxide films was done with the apparatus shown in FIG. 1 at a substrate temperature of 400° C. The partial pressure of oxygen in each rare gas and the pressure in the process chamber were fixed at 3% and 1 Torr, respectively. For comparison, the interface level density in a thermal oxide film formed at a substrate temperature of 900° C. in the atmosphere of 100% oxygen is also shown. The interface level density of the oxide film formed using Kr gas is the lowest and it is equivalent to the interface level density of the thermal oxide film formed in the dry oxidation atmosphere at 900° C.

Figure 7:
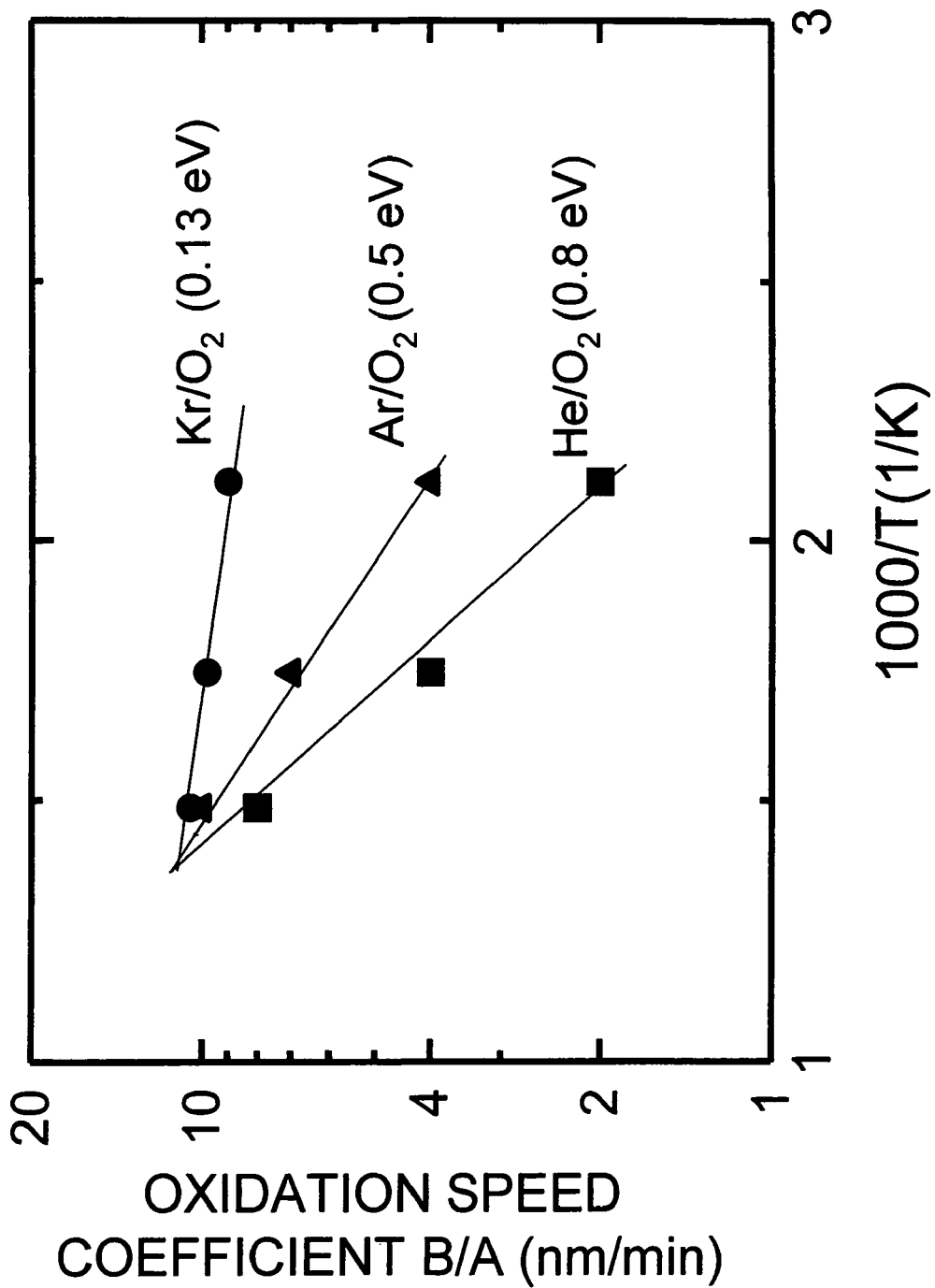
FIG. 7 is a graph showing a result of examination of the relation between kinds of rare gases and activating energy for silicon oxide film growth calculated from silicon oxide film growing speed.

FIG. 7 shows the relation between kinds of rare gases and activating energy for silicon oxide film growth calculated from silicon oxide film growing speed. Formation of silicon oxide films was done with the apparatus shown in FIG. 1 at substrate temperatures within the range of 200 to 400° C. The partial pressure of oxygen in each rare gas and the pressure in the process chamber were fixed at 3% and 1 Torr (133 Pa), respectively. In case of oxidation using helium gas (He) and argon gas (Ar), the activating energies are high as 0.5 eV and 0.8 eV, respectively. In case of using Kr gas, however, the activating energy can be held down to 0.13 eV. That is, if the dependence on temperature is very low and atomic oxygen is efficiently generated, even at a low temperature as 200° C., a sufficiently high oxidation speed is realized.

Figure 8:
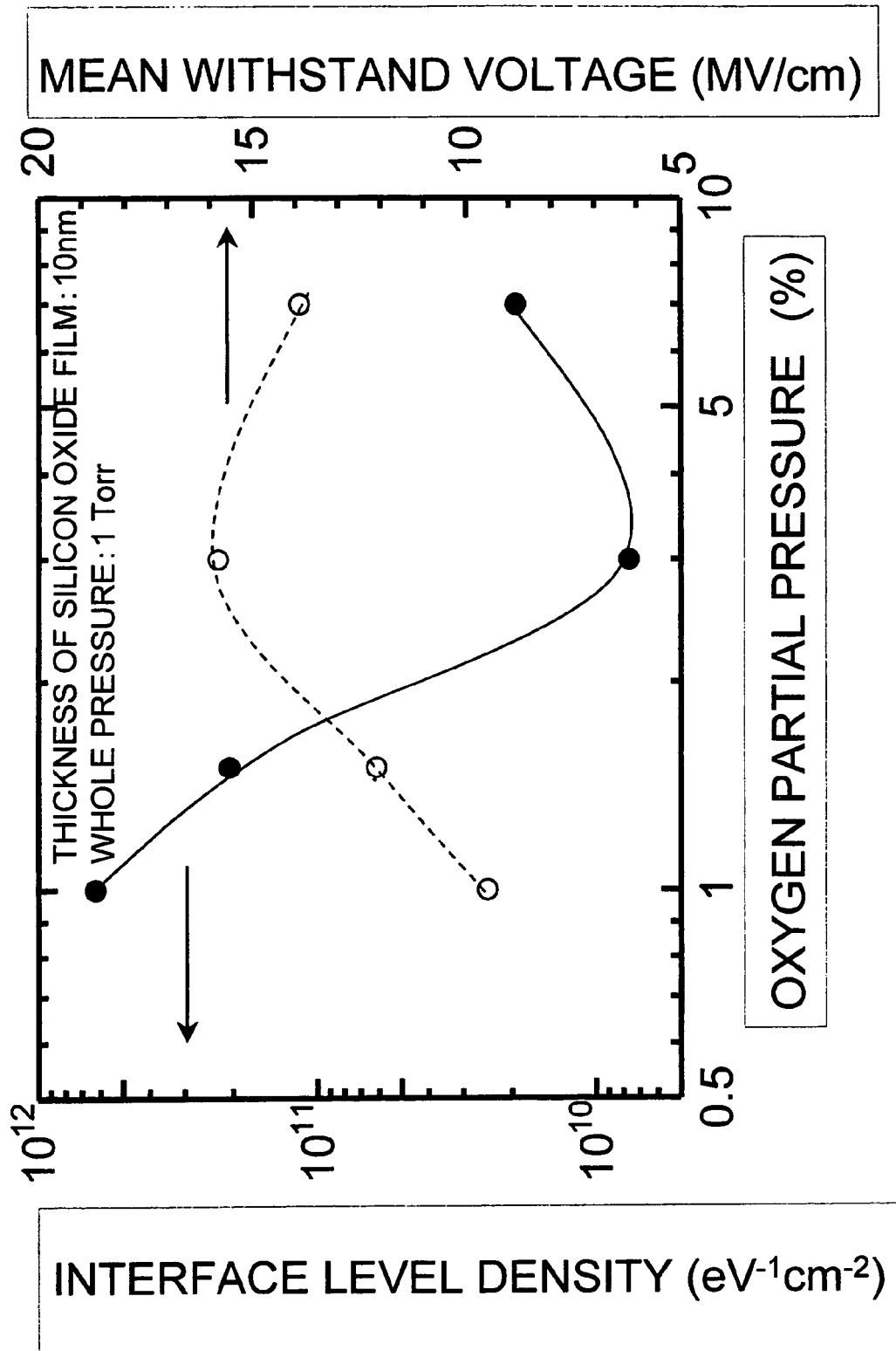
FIG. 8 is a graph showing a result of examination of the relations between oxygen partial pressure in Kr in a silicon oxide film formation atmosphere and interface level density in a silicon oxide film formed and its withstand voltage.

FIG. 8 shows a result of examination of the relations between the oxygen partial pressure in Kr in a silicon oxide film formation atmosphere, the withstand voltage of a silicon oxide film, and the interface level density in a silicon oxide film formed. In this case, the pressure in the process chamber was fixed at 1 Torr (133 Pa). When the oxygen partial pressure in Kr is 3%, the interface level density becomes the minimum and its value equivalent to the interface level density in a thermal oxide film is obtained. Besides, the withstand voltage of the silicon oxide film becomes the maximum also in the vicinity of 3% of the oxygen partial pressure. From the result of FIG. 8, the oxygen partial pressure upon oxidation using Kr/O$_2$ mixture gas is suitably 2 to 4%.

Figure 9:
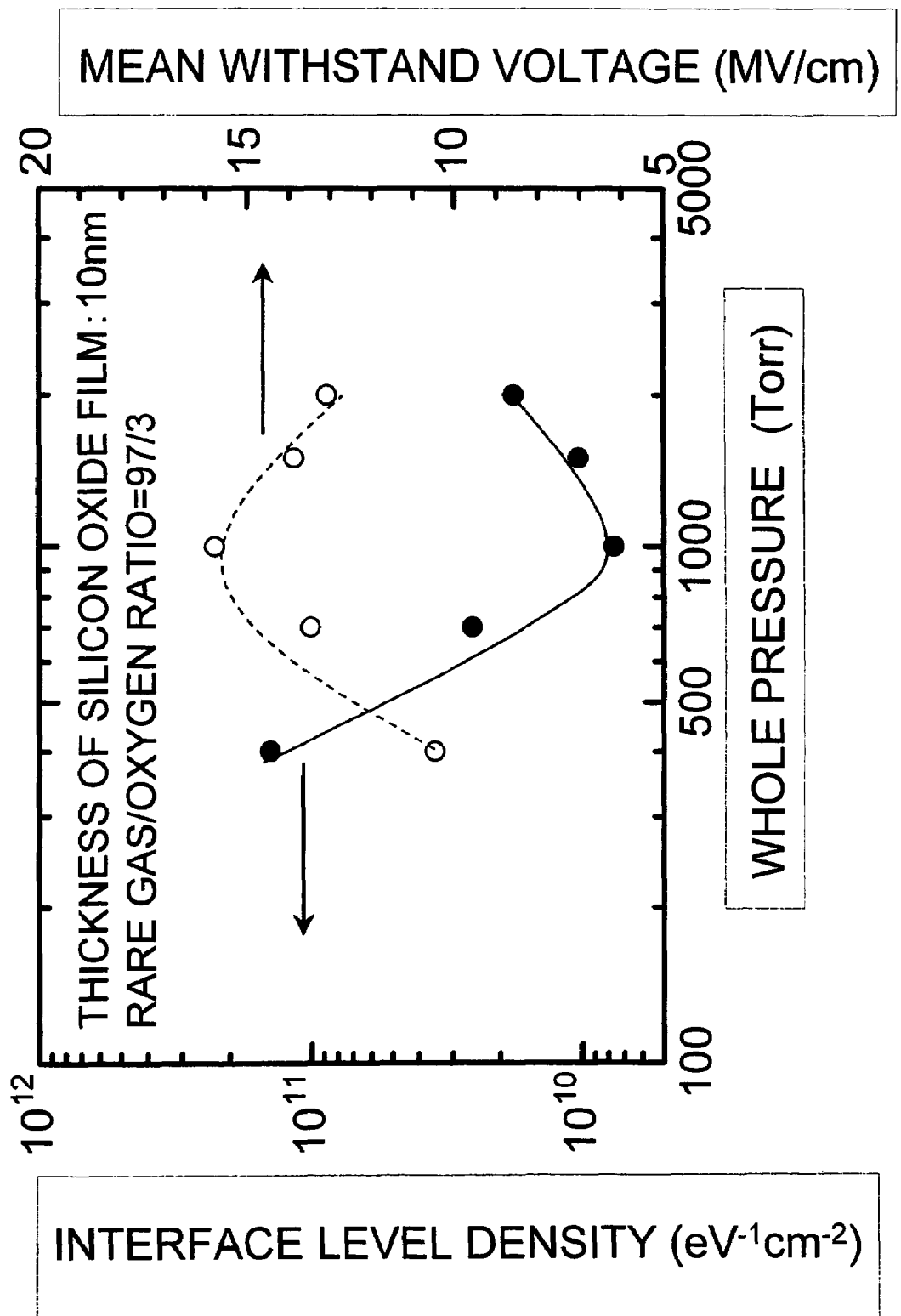
FIG. 9 is a graph showing a result of examination of the relations between the whole pressure in a process chamber in a silicon oxide film formation atmosphere and interface level density in a silicon oxide film formed and its withstand voltage.

FIG. 9 shows the relations between pressure upon silicon oxide film formation, and the withstand voltage and the interface level density of a silicon oxide film. In this case, the oxygen partial pressure was 3%. When the pressure upon film formation is near 1 Torr, the withstand voltage of the silicon oxide film becomes the maximum and the interface level density becomes the minimum. From this, when an oxide film is formed using Kr/O$_2$ mixture gas, the pressure upon film formation is optimally 800 to 1200 mTorr (106 to 160 Pa).

Figure 10:
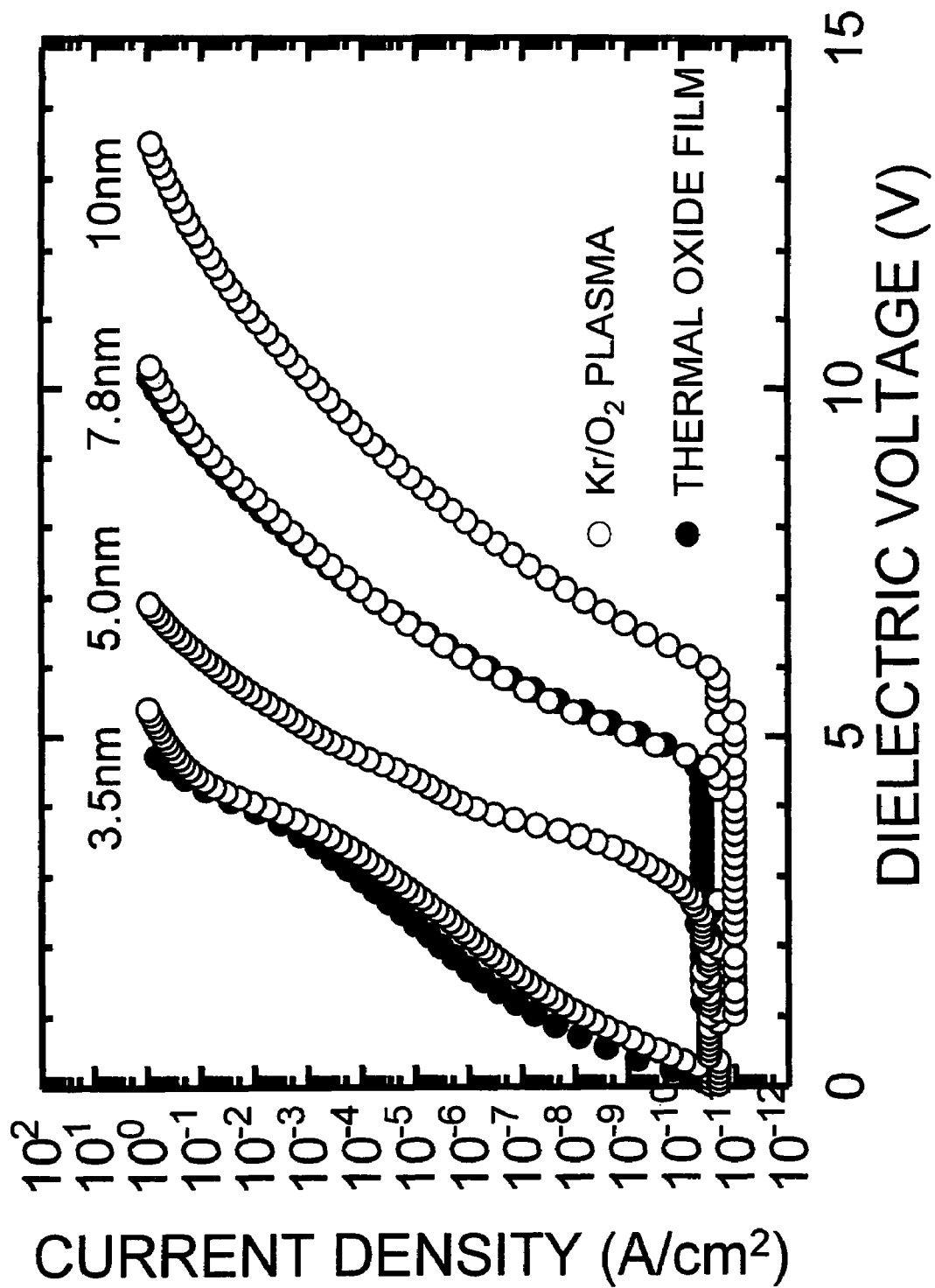
FIG. 10 is a graph showing the current-voltage characteristics of 3.5 nm, 5.0 nm, 7.8 nm, and 10 nm-thick silicon oxide films obtained with microwave (2.45 GHz)-excited high density plasma of Kr/O$_2$=97%/3% at a substrate temperature of 400° C. when electrons have been injected from the substrate side and a positive voltage is applied through electrodes (for reference, the characteristics in case of the same thickness, 1000° C., and dry oxidation are also shown)

FIG. 10 shows the current-voltage characteristics of 3.5 nm, 5.0 nm, 7.8 nm, and 10 nm-thick silicon oxide films obtained with microwave (2.45 GHz)-excited high density plasma of Kr/O$_2$=97%/3% at a substrate temperature of 400° C. when a positive voltage is applied through electrodes to inject electrons into the silicon oxide films from the substrate side. For reference, the characteristics in case of the same thickness and 1000° C. dry oxidation are also shown. In the lower electric field region, the electric currents of the silicon oxide films grown with Kr/O$_2$ are less than those of the thermal oxide films. In the higher electric field region, both films show quite the same characteristics.

Figure 11:
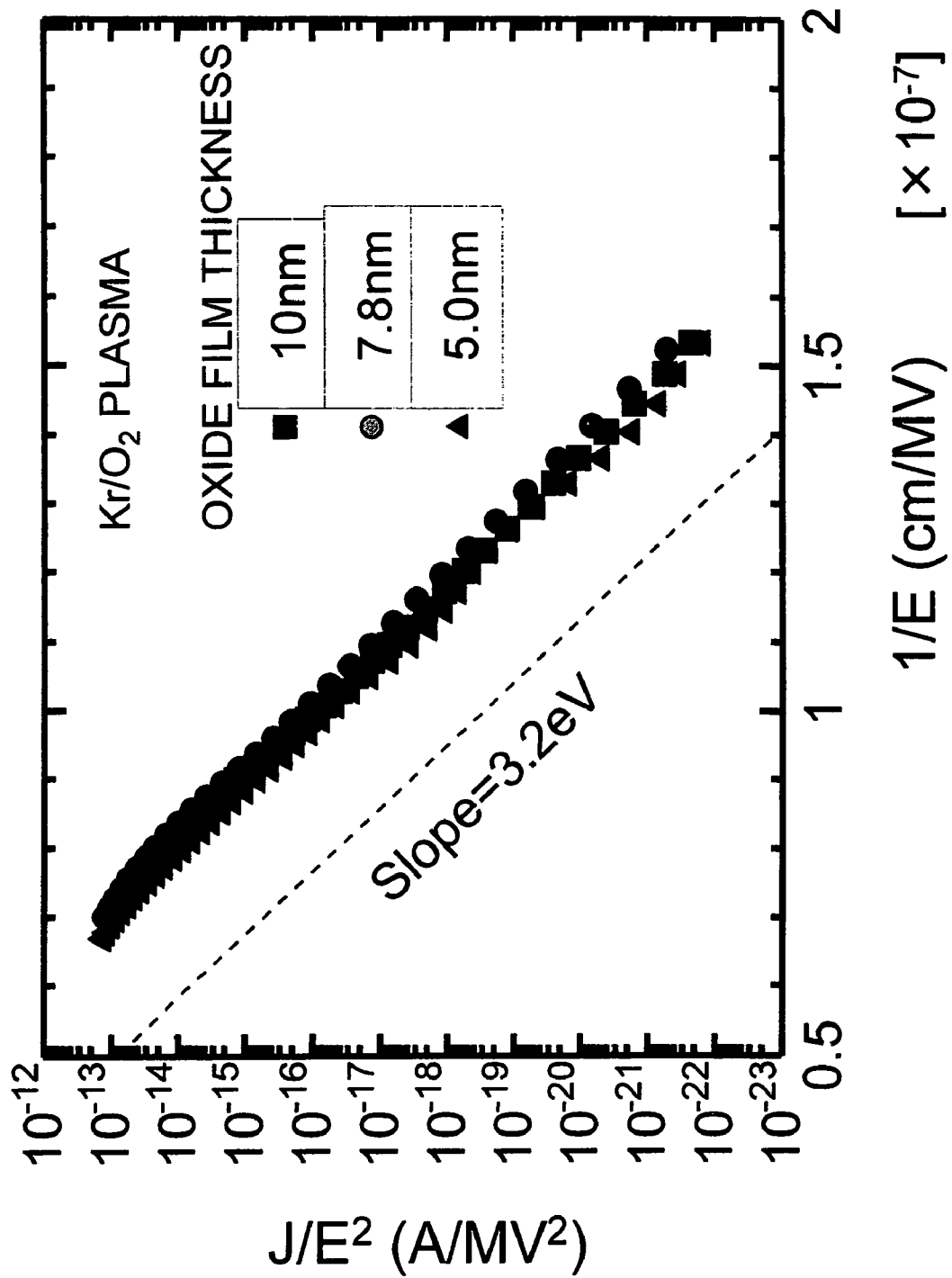
FIG. 11 is a graph showing the $J^2/E$-I/E characteristic, i.e., the F-N characteristic when the current density flowing through a silicon oxide film formed with microwave (2.45 GHz)-excited high density plasma of $Kr/O_2=97\%/3\%$ is J (A/cm$^2$), and the electric field intensity is E (MV/cm) (three kinds in thickness of silicon oxide films are used, i.e., 5.0 nm, 7.8 nm, and 10 nm)

FIG. 11 shows the J/E$^2$-I/E characteristic, i.e., the F-N characteristic when the current density flowing through a silicon oxide film formed with microwave (2.45 GHz)-excited high density plasma of Kr/O$_2$=97%/3% is J (A/cm$^2$), and the electric field intensity is E (MV/cm). Although three kinds in thickness of silicon oxide films were used, i.e., 5.0 nm, 7.8 nm, and 10 nm, the same characteristic was obtained almost irrespective of film thickness. It is found that F-N currents between $10^{-13}$ to $10^{-22}$, i.e., over the range of nine figures, flow. The barrier height between silicon/silicon oxide films is 3.2 eV.

Figure 12A:
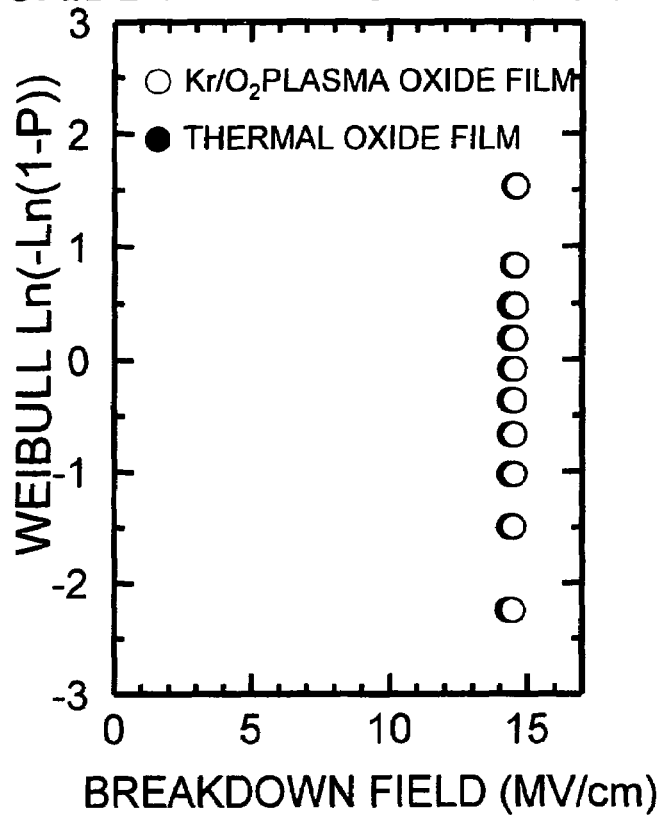
FIGS. 12A to 12C are graphs showing the breakdown fields of silicon oxide films formed with microwave (2.45 GHz)-excited high density plasma of $Kr/O_2=97\%/3\%$, and 1000° C. dry-oxide films in relation to three kinds of films, i.e., 3.5 nm, 5.0 nm, and 7.8 nm, respectively.
Figure 12B:
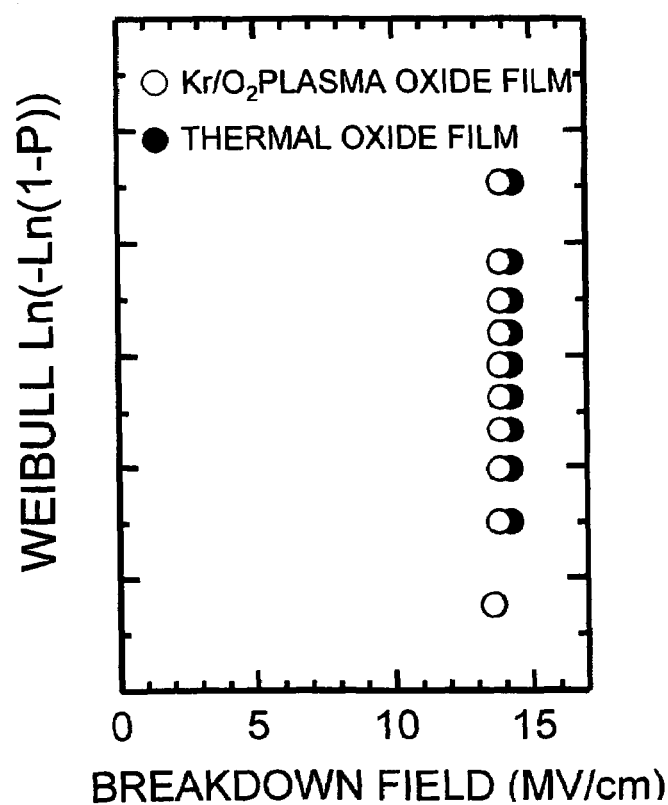
Figure 12C:
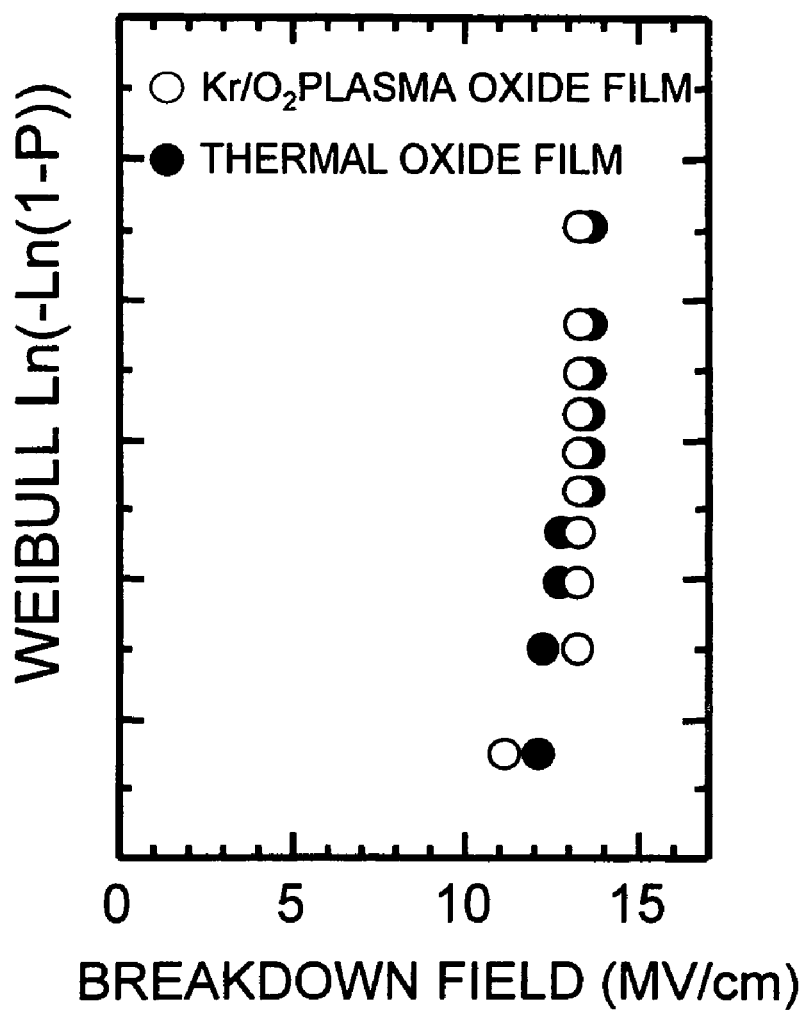

FIGS. 12A to 12C show the breakdown fields of silicon oxide films formed with microwave (2.45 GHz)-excited high density plasma of Kr/O$_2$=97%/3%, and 1000° C. dry-oxide films in relation to three kinds of films, i.e., 3.5 nm, 5.0 nm, and 7.8 nm as A, B, and C, respectively. In any thickness obtained were quite the same breakdown field intensities as those of the corresponding thermal oxide film.

Figure 13:
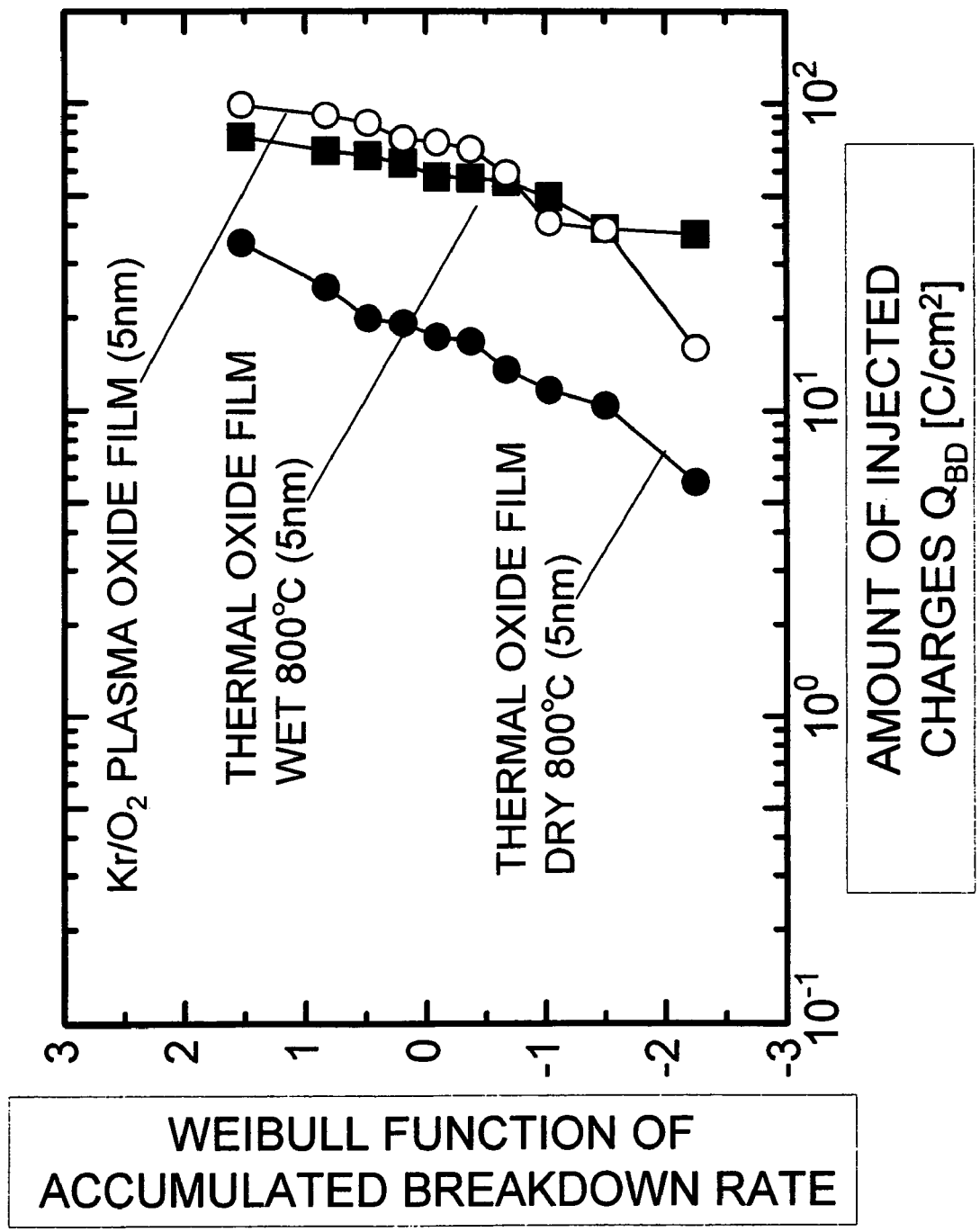
FIG. 13 is a graph showing the amounts of charges QBD (Charge-to-Breakdown) till silicon oxide films are broken down when a stress current of 1 A/cm$^2$ is applied from the substrate side, in relation to $Kr/O_2$ high density plasma oxidation, 800° C. wet oxidation, and 900° C. dry oxidation.

FIG. 13 shows the amounts of charges QBD (Charge-to-Breakdown) till silicon oxide films are broken down when a stress current of 1 A/cm$^2$ is applied from the substrate side, in relation to Kr/O$_2$ high density plasma oxidation, 800° C. wet oxidation, and 900° C. dry oxidation. The thickness is 5.0 nm. The silicon oxide film grown with Kr/O$_2$ high density plasma shows its QBD value higher than those of 800° C. wet oxidation and 900° C. dry oxidation.

As for the above-described various characteristics, even though oxidation was done at a low temperature as 400° C., the oxide films grown with Kr/O$_2$ high density plasma show the characteristics superior to those of the conventional high-temperature thermal oxide films. We suspect this is because the stress in the oxide film or at the Si/SiO$_2$ interface is relaxed by Kr being contained in the film, the charges in the film and the interface level density are reduced, and thereby the electrical characteristics of the silicon oxide film are considerably improved. In particular, we suspect that containing Kr at a surface density of 5×10$^{11}$ cm$^{-1}$ or less contributes to the improvement of the electrical characteristics of the silicon oxide film.

Figure 14:
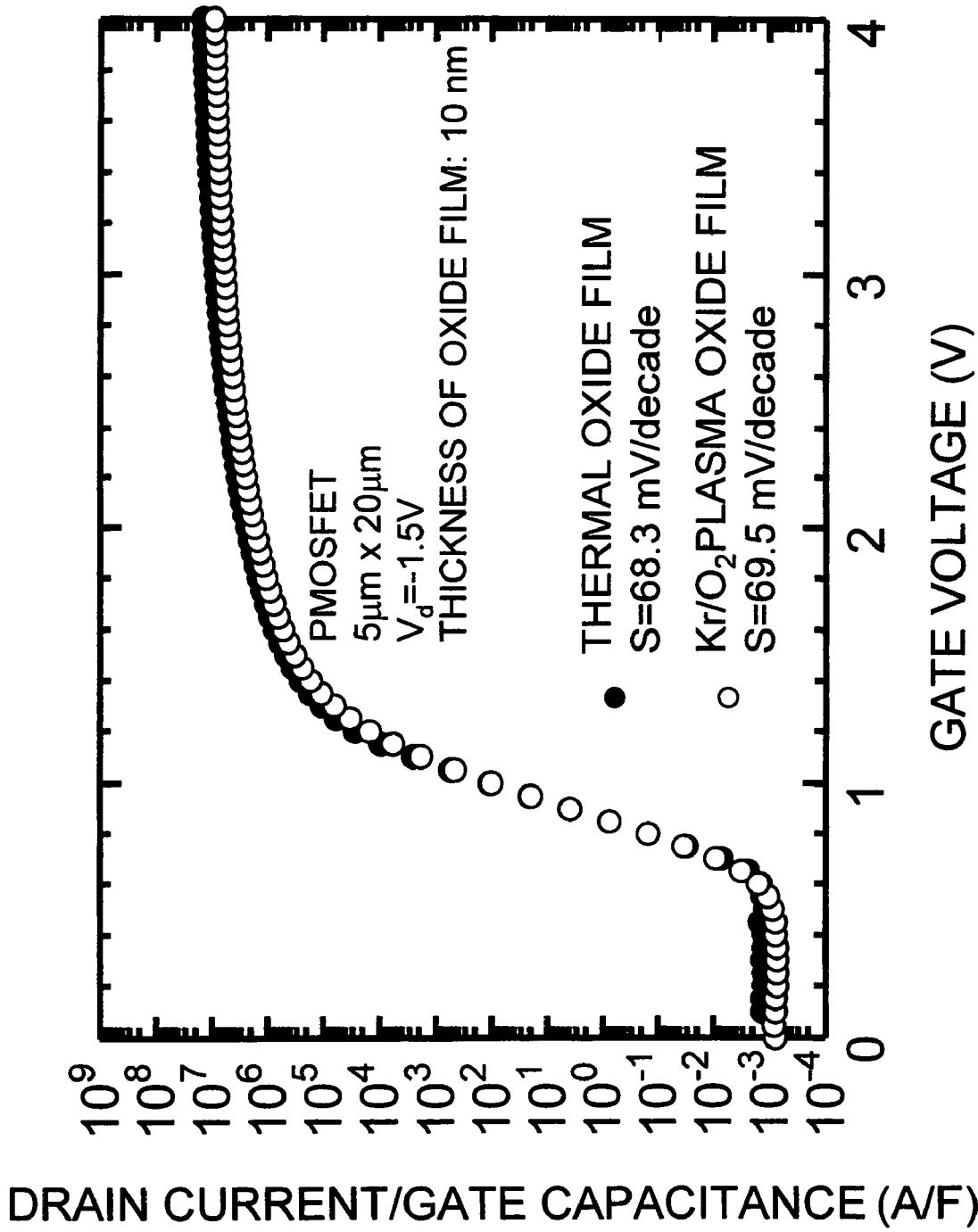
FIG. 14 is a graph showing the subthreshold characteristics of MOS transistors formed on monocrystalline silicon substrates, which graph shows the characteristics when a gate oxide film formed with $Kr/O_2$ high density plasma at a substrate temperature of 400° C. and a conventional gate oxide film formed by about 900° C. thermal oxidation are used as the gate insulating films.

FIG. 14 shows the subthreshold characteristics of MOS transistors formed on monocrystalline silicon substrates, which figure shows the characteristics when a gate oxide film formed with the apparatus of FIG. 1 using Kr/O$_2$ high density plasma at a substrate temperature of 400° C. and a conventional gate oxide film formed by about 900° C. thermal oxidation are used as the gate insulating films. The subthreshold characteristic (marks ○ in the figure) of the MOS transistor with its gate oxide film formed using the apparatus of FIG. 1 shows substantially the same characteristic as the subthreshold characteristic (marks ● in the figure) of the gate oxide film by thermal oxidation.

Figure 15:
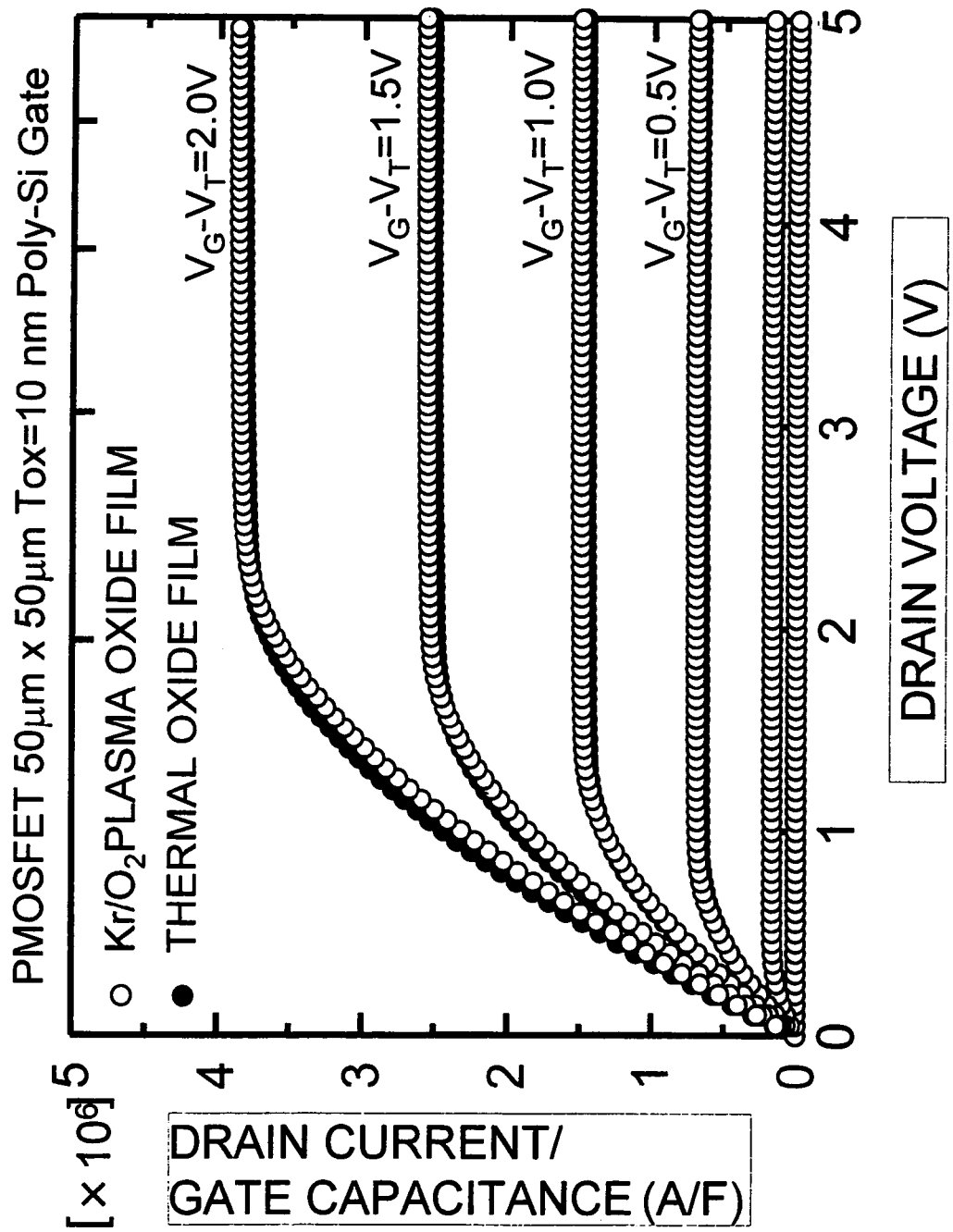
FIG. 15 is a graph showing the relation between the drain current and the gate voltage of MOSFET (in the figure, marks ○ represent a case wherein a $Kr/O_2$ plasma oxide film is used as the gate insulating film, and, in the figure, marks ● represent a case wherein a thermal oxide film is used as the gate insulating film)

FIG. 15 shows the relation between the drain current and the gate voltage of MOSFET. In the figure, marks ○ represent a case wherein a Kr/O$_2$ plasma oxide film is used as the gate insulating film, and, in the figure, marks ● represent a case wherein a thermal oxide film is used as the gate insulating film. The oxide film thickness is 10 nm. Both show quite the same characteristic.

It was proved that sufficiently high quality semiconductor device formation is possible using low-temperature formed gate insulating films.

To realize an oxide film of the present invention, another plasma process apparatus that enables low-temperature oxide film formation using plasma may be used. For example also possible is formation with a two-stage shower plate type plasma process apparatus having first gas discharging means for discharging Kr gas for exciting plasma by a microwave, and second gas discharging means for discharging oxygen gas different from the above first gas discharging means.

Embodiment 2

Figure 16A:
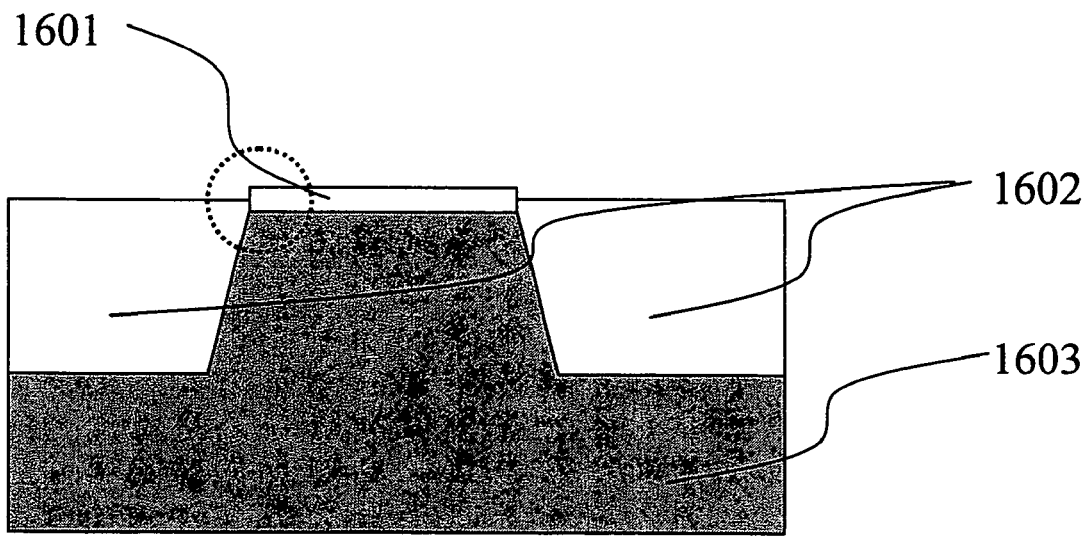
FIGS. 16A and 16B are conceptional views showing a shallow trench isolation structure.
Figure 16B:
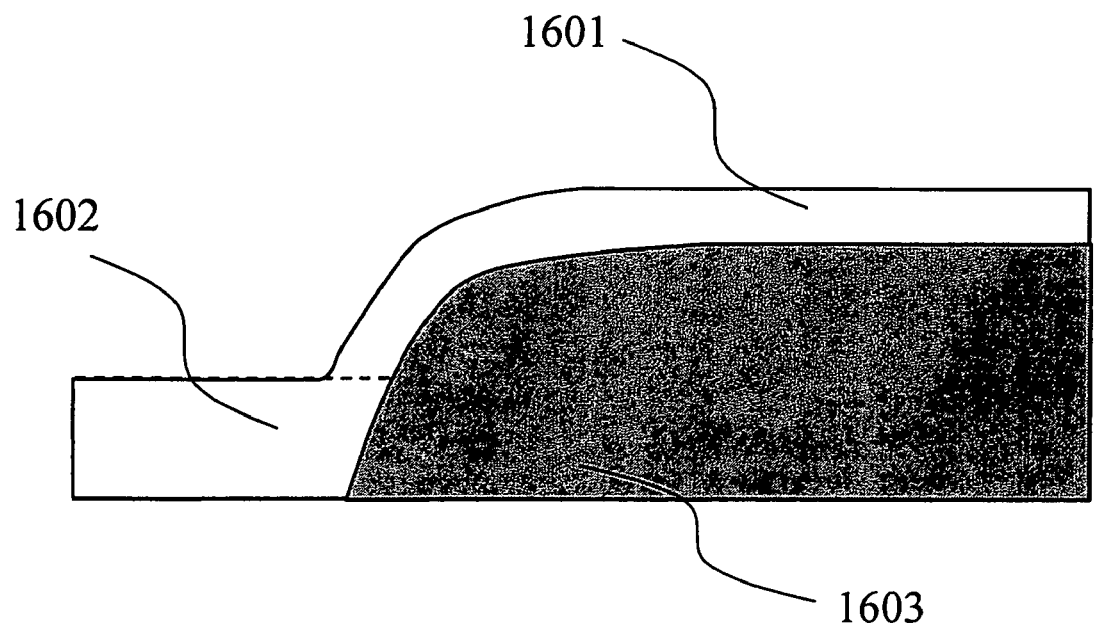

FIGS. 16A and 16B (an enlarged view in a circle shown by a broken line of FIG. 16A) show conceptional views of a shallow trench isolation. This shallow trench isolation is formed by the manner that a silicon substrate 1603 surface is etched with plasma, a silicon oxide film 1602 formed by a CVD method is formed on the silicon substrate surface after being etched, and further the silicon oxide film formed is polished using a CMP method. After polishing, sacrificial oxidation is done by exposing the silicon substrate to a 800 to 900° C. oxidative atmosphere. A silicon oxide film formed by the sacrificial oxidation is etched off in a liquid chemical containing fluoric acid to obtain a highly pure silicon surface. After this, the substrate surface is cleaned using RCA cleaning, and a gate insulating film 1601 is formed. When a conventional thermal oxidation method was used for the gate insulating film formation process, irrespective of formation conditions (dry oxidation or wet oxidation, or formation temperature), as shown in FIG. 17A, thinning of the gate insulating film 1071' was confirmed at an edge portion of the shallow trench isolation. Reference numerals 1702 and 1703 denotes the same components as the silicon oxide film 1602 and the silicon substrate 1603, respectively.

Figure 17B:
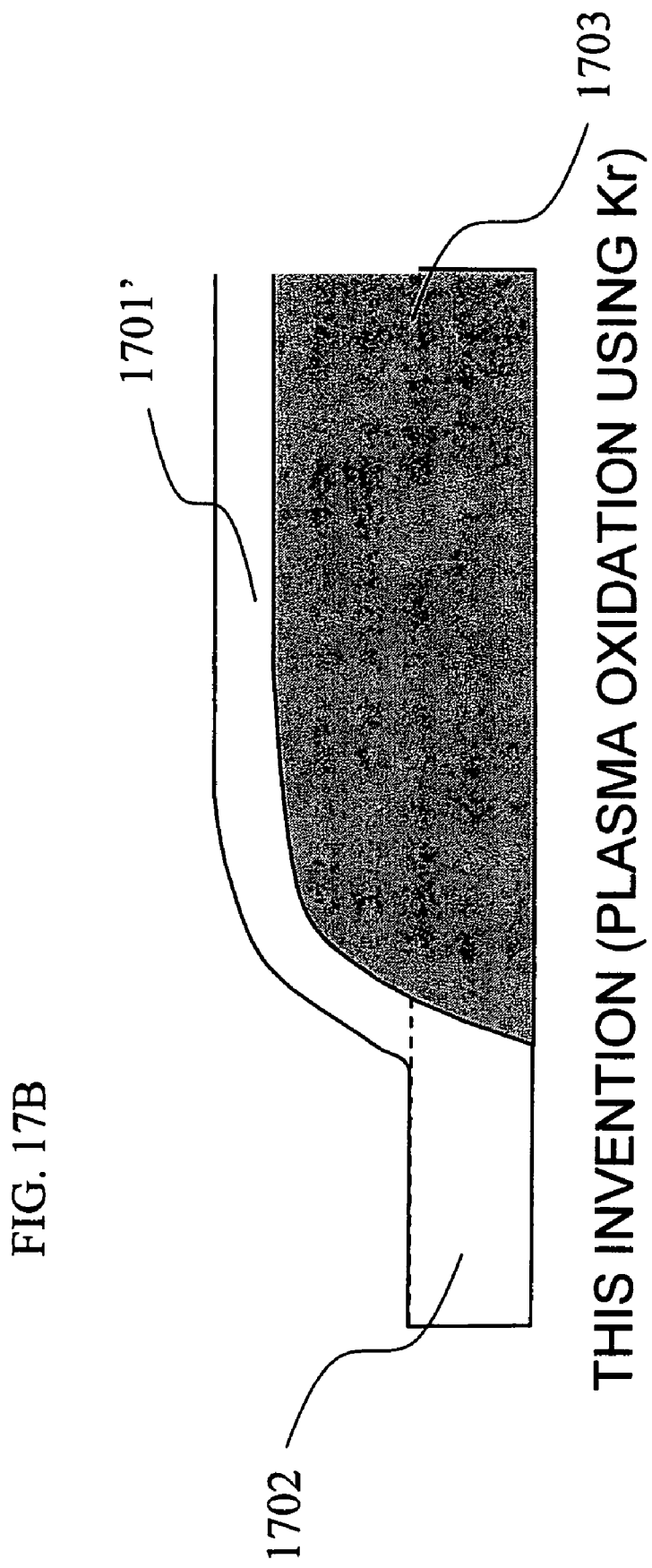

Contrastingly, as shown in FIG. 17B, when the gate insulating film 1071 is formed by oxidation using Kr/O$_2$ high density plasma according to the present invention, thinning of the gate insulating film 1071 does not occur at the edge portion of the shallow trench isolation.

Figure 18:
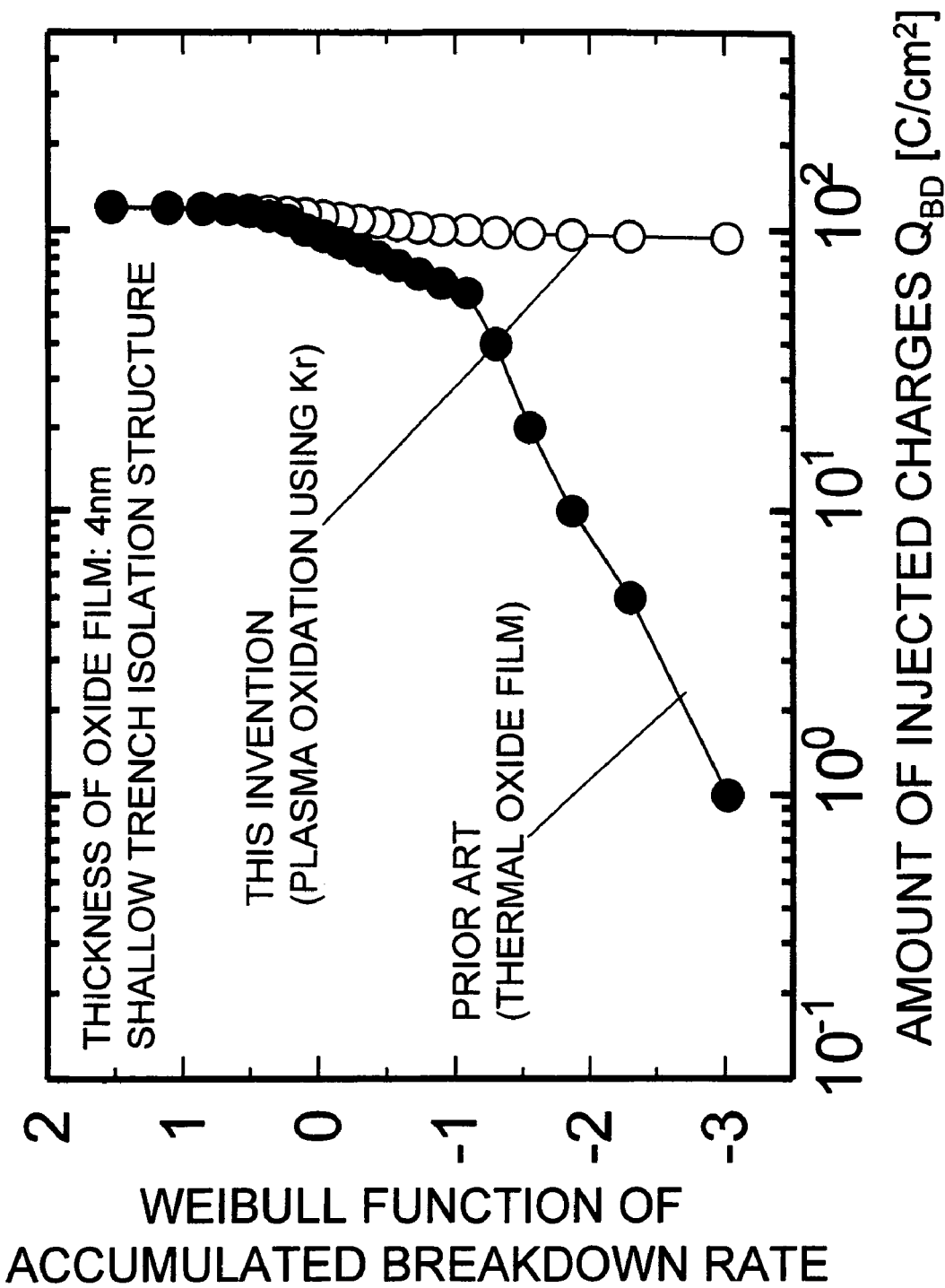
FIG. 18 is a graph showing a difference between the QBD characteristics of MOS capacitors when the shallow trench isolation structure is applied to a prior art (a case of thermal oxidation) and the present invention (oxidation with $Kr/O_2$ high density plasma)

FIG. 18 shows the QBD characteristics when the gate oxide film of a MOS capacitor having a shallow trench isolation structure is formed by 800° C. wet oxidation, and when a silicon oxide film is formed by oxidation using Kr/O$_2$ high density plasma. As stress, electric charges were injected from the substrate side toward the silicon oxide film with a low electric current of 1 A/cm$^2$. It was confirmed that QBD of the silicon oxide film formed by 800° C. wet oxidation had a wide distribution on the lower QBD side caused by thinning at an shallow trench isolation edge portion, and the reliability of the device was bad. However, the QBD characteristic of the silicon oxide film formed by oxidation using Kr/O$_2$ high density plasma is very uniform. This is because thinning of the silicon oxide film thickness does not occur at the shallow trench isolation edge portion. By using the silicon oxide film formation technique of the present invention, the reliability of the device was considerably improved.

Figure 19:
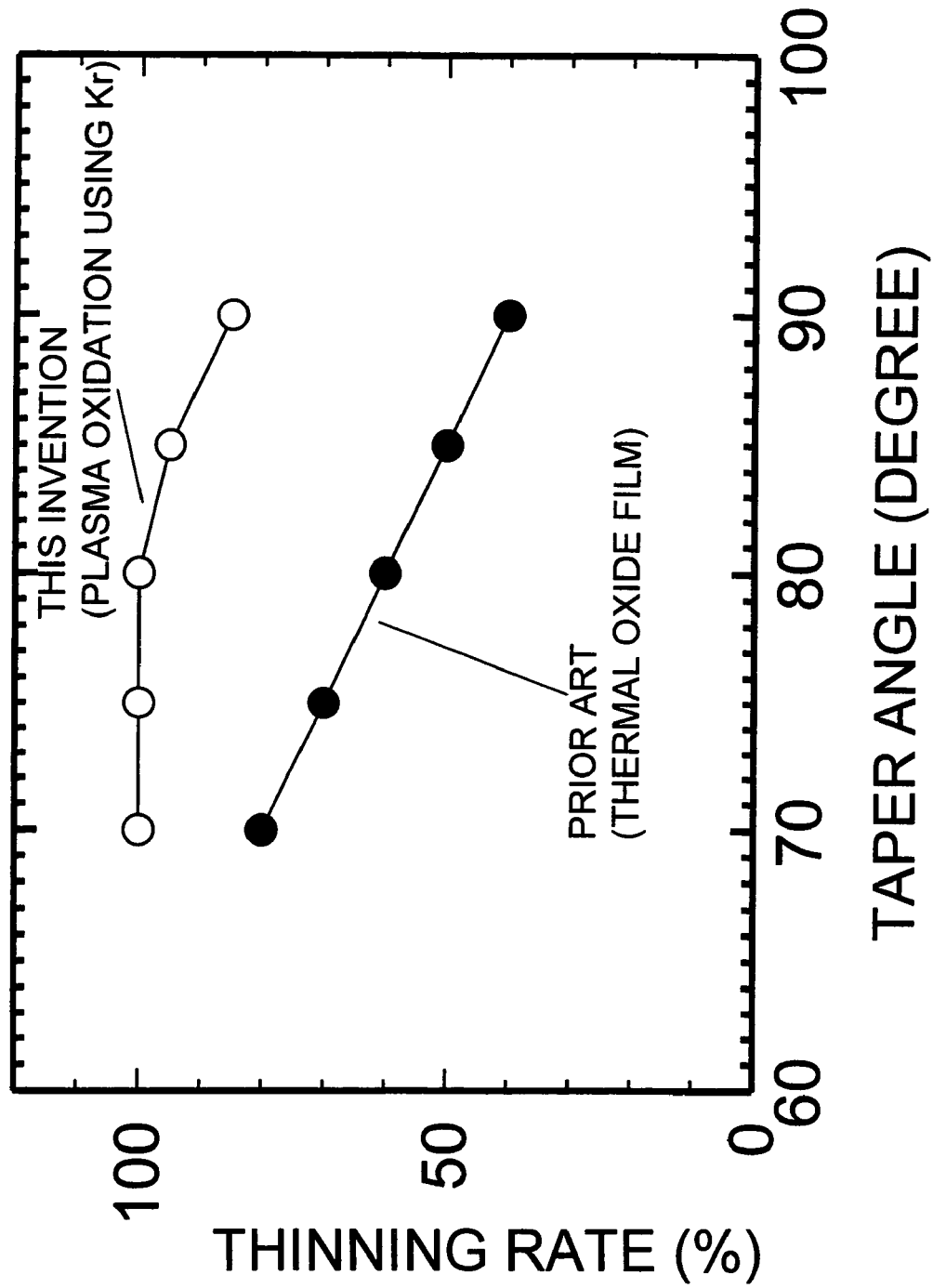
FIG. 19 is a graph showing the relation between the shallow trench isolation taper angle and the edge portion film thinning rate when the shallow trench isolation structure is applied to a prior art (a case of thermal oxidation) and the present invention (oxidation with $Kr/O_2$ high density plasma)

FIG. 19 shows the relation between the taper angle of the shallow trench isolation and the thinning rate of the silicon oxide film. In a silicon oxide film formed by a thermal oxidation method, as the taper angle increased, thinning at an shallow trench isolation edge portion went intensive, and it was hard to make the taper angle less than 75 degrees for ensuring the device reliability. When the silicon oxide film is formed by oxidation using Kr/O$_2$ high density plasma according to the present invention, even if the taper angle increases to more than 75 degrees, the uniformity of the silicon oxide film can be held down to 30% or less even at the shallow trench isolation edge portion. Because it is possible to ensure the reliability even if the taper angle of the shallow trench isolation is increased, because the area of the element isolating region reduces, further improvement of integration of semiconductor elements becomes possible.

Embodiment 3

Gate oxidation with Kr/O$_2$ microwave-excited high density plasma using the apparatus of FIG. 1 is optimal for integrated device fabrication on a metallic substrate SOI wafer in which a conventional high-temperature process can not be used.

Figure 20:
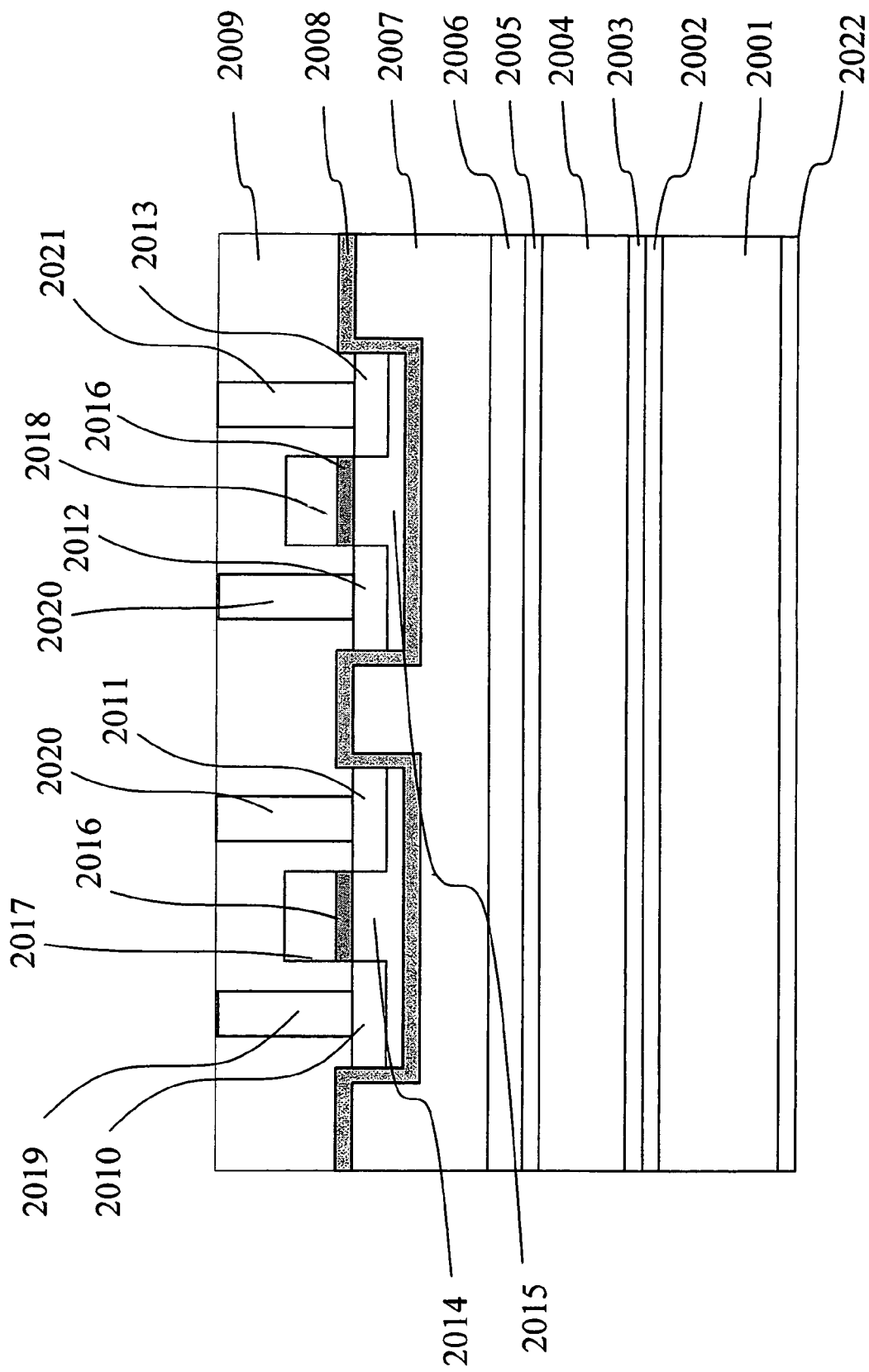
FIG. 20 is a sectional view of MOS transistors made on a metallic substrate SOI.

FIG. 20, is a sectional view of MOS transistors made on a metallic substrate SOI. Reference numeral 2001 denotes n++, p++ low-resistance semiconductor, 2002 does a silicide layer such as NiSi, 2003 does a conductive nitride layer such as TaN or TiN, 2004 does a metal layer such as Cu, 2005 does a conductive nitride layer such as TaN or TiN, 2006 does n++, p++ low-resistance semiconductor layer, 2007 does a nitride insulating film such as AlN or Si$_3$N$_4$, 2008 does a SiO$_2$ film, 2009 does an insulating film of SiO$_2$, BPSG, or a combination of them, 2010 does an n++ drain region, 2011 does an N++ source region, 2012 does a p++ drain region, 2013 does a P++ source region, 2014 and 2015 do a high-resistance semiconductor layer, 2016 does a $SiO_2$ film formed with $Kr/O_2$ microwave-excited high density plasma according to the present invention, 2017 and 2018 do an nMOS gate electrode and a pMOS gate electrode made of, e.g., Ta, Ti, TaN/Ta, TiN/Ti, or the like, 2019 does a nMOS source electrode, and 2020 does nMOS and PMOS drain electrodes. Reference numeral 2021 denotes a pMOS source electrode. Reference numeral 2022 denotes a substrate surface electrode. For the substrate including a Cu layer protected by TaN or TiN, the thermal treatment temperature must be 700° C. or less in order to suppress the diffusion of Cu. The n++, p++ source/drain regions are formed by a thermal treatment of 550° C. after ion implantation of As+, $AsF_2$+, or $BF_2$+.

Until now, there was no technique for forming a high-quality oxide film at 700° C. or less. By $Kr/O_2$ microwave-excited high density plasma oxidation, fabrication of the metallic substrate SOIMOSLSI shown in FIG. 20 first became possible.

Figure 21:
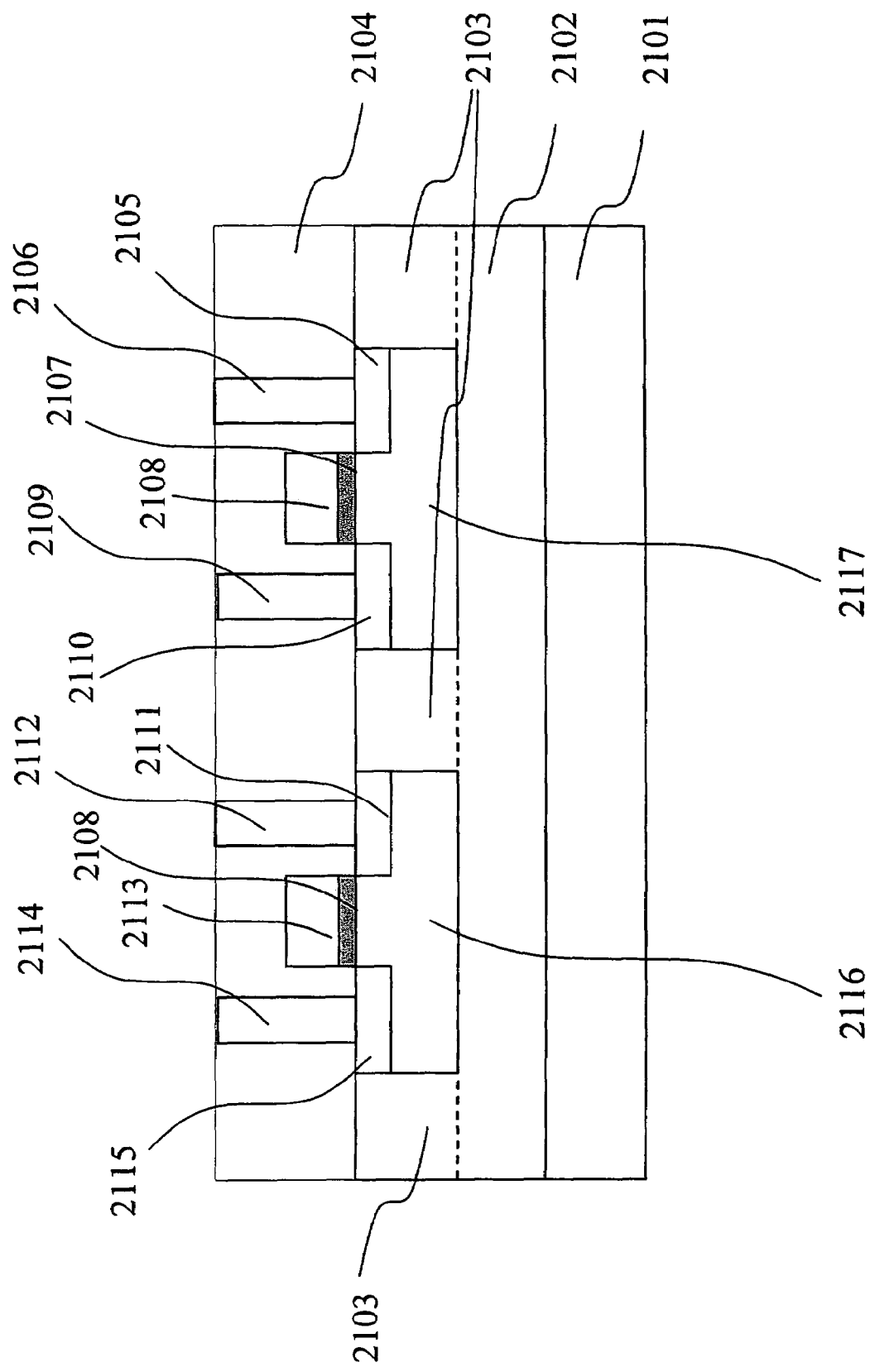
FIG. 21 is a sectional view of MOS transistors made on a SOI substrate.

FIG. 21 is a conceptional view of a SOI device. Here, 2101 denotes a silicon substrate, 2102 does a $SiO_2$ layer, 2103 does a silicon oxide film formed with $Kr/O_2$ high density plasma, 2104 does an insulating film of $SiO_2$, BPSG, or a combination of them, 2105 does an n++ source region, 2106 does an nMOS source electrode, 2107 does a $SiO_2$ film formed with $Kr/O_2$ high density plasma according to the present invention, 2108 does an nMOS gate electrode, 2109 does a drain electrode, 2110 does an n++ drain region, 2111 does a p++ drain region, 2112 does nMOS and pMOS drain electrodes, 2113 does a pMOS gate electrode, 2114 does a pMOS source electrode, 2115 does a p++ source region, 2116 does an n-type silicon layer, and 2117 does a p-type silicon layer.

Figure 22:
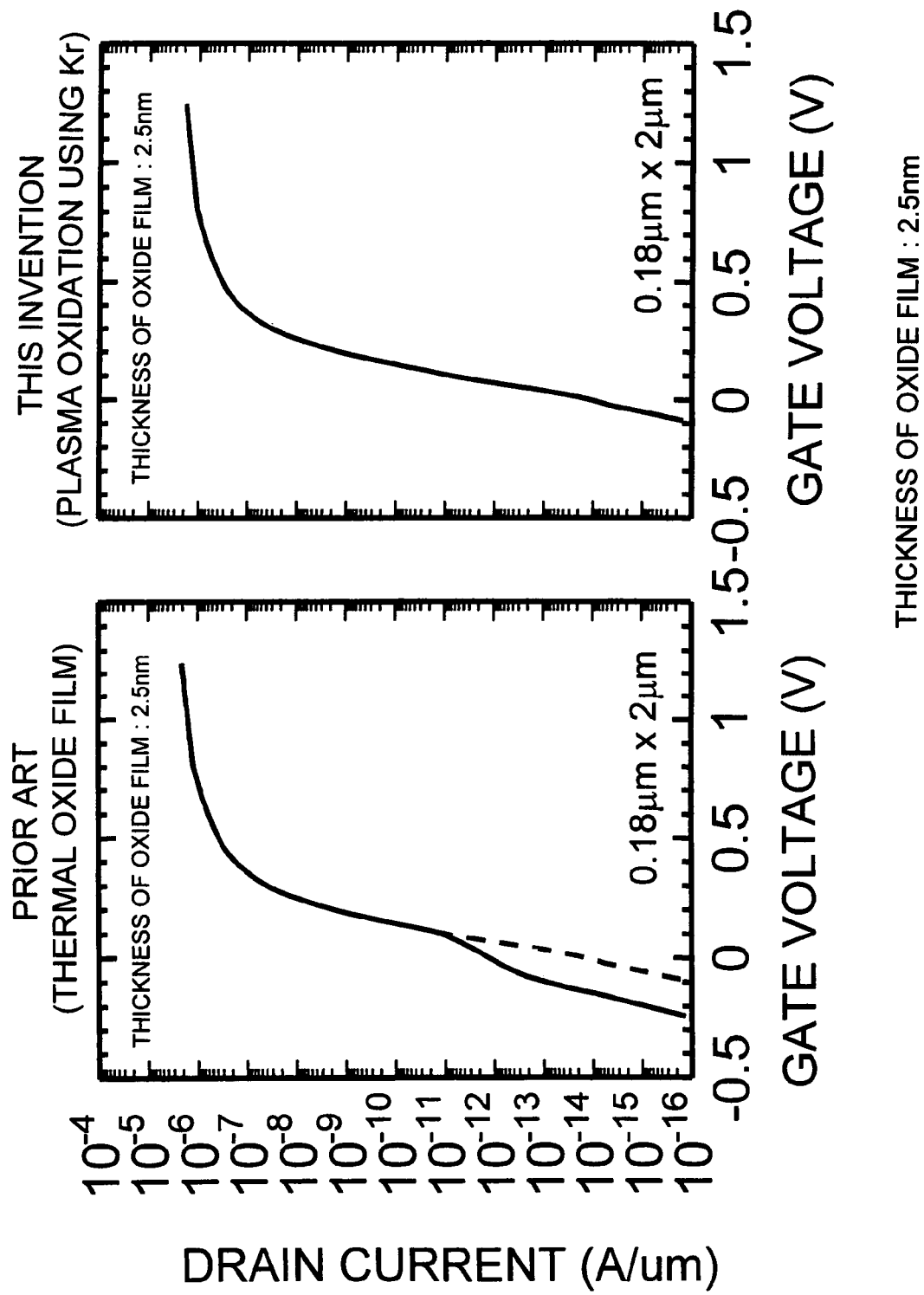
FIG. 22 are graphs showing subthreshold characteristics when a gate insulating film of a device is applied to a prior art (a case of thermal oxidation) and the present invention (oxidation with $Kr/O_2$ high density plasma)

Using this device structure, in case that a thermal oxide film was used for the gate insulating film, and in case that the gate insulating film was formed by oxidation using $Kr/O_2$ high density plasma, the subthreshold characteristics of transistors are shown in FIG. 22. When the gate insulating film was formed by thermal oxidation, in the subthreshold characteristic, a kink due to bad coverage of the silicon oxide film is observed. When the gate insulating film was formed by oxidation using $Kr/O_2$ high density plasma, any kink is not observed in the subthreshold characteristic. Even in case of using a mesa type isolation structure, by forming the gate insulating film by oxidation using $Kr/O_2$ high density plasma, considerable improvement of reliability is possible.

Embodiment 4

Figure 23:
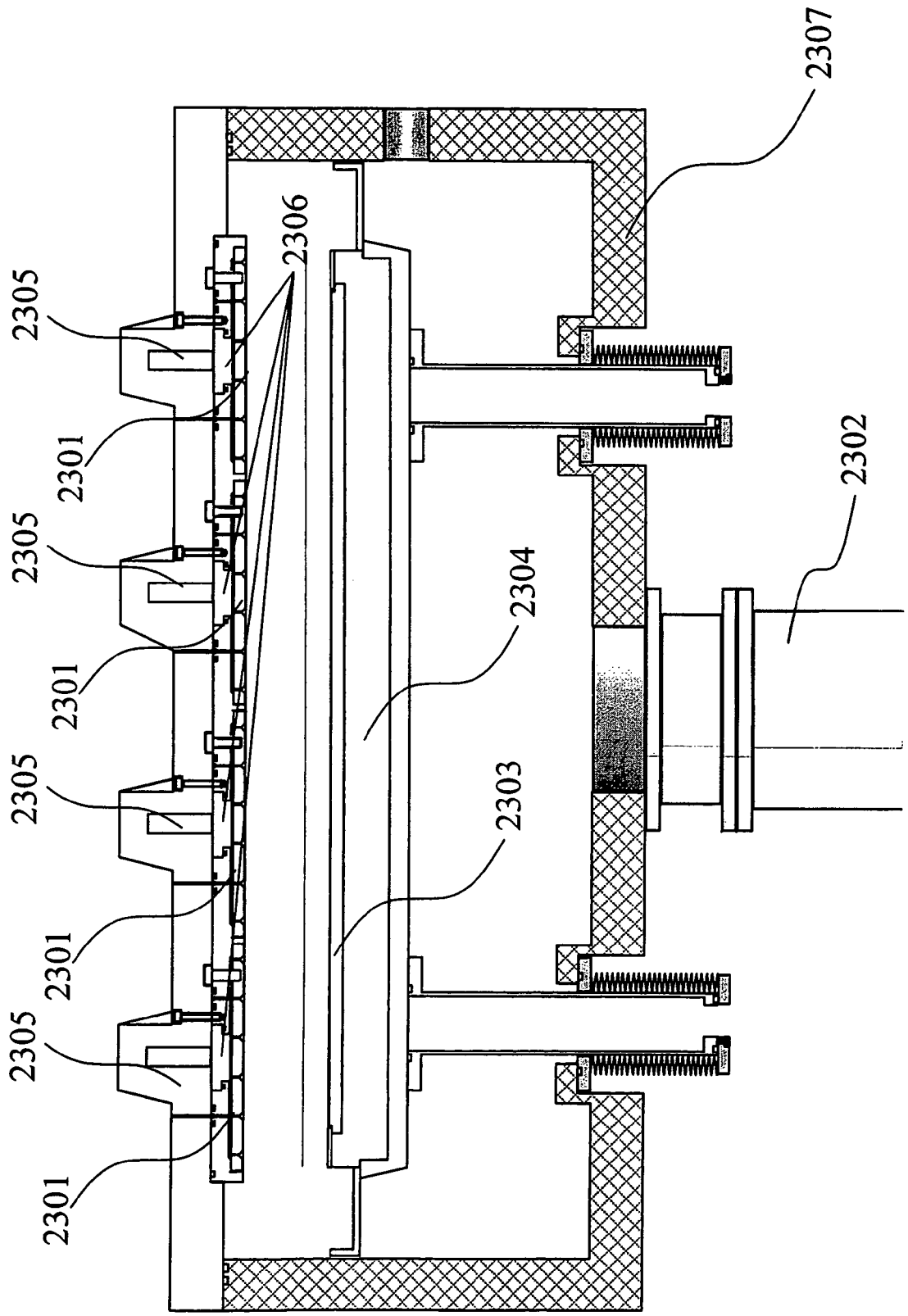
FIG. 23 is a conceptional view of a microwave-excited high density plasma apparatus for glass substrates and plastic substrates.

FIG. 23 is a conceptional view showing an example of apparatus for oxidizing a rectangular substrate such as a glass substrate or a plastic substrate. A vacuum vessel (process chamber) 2307 is put in a depressurized state, $Kr/O_2$ mixture gas is introduced through a shower plate 2301, gas is discharged through a thread groove pump 2302, and, for example, the pressure in the process chamber is set at 1 Torr. A glass substrate 2303 is placed on a sample table 2304 with a heating system, and, for example, setting is made such that the temperature of the glass substrate becomes 300° C. A microwave is supplied from a slit of a rectangular waveguide tube 2305 through a dielectric plate 2306 into the process chamber to generate high density plasma in the process chamber. The shower plate 2301 serves also as a waveguide where the microwave radiated from the waveguide tube is propagated to the right and left as a surface wave.

Figure 24:
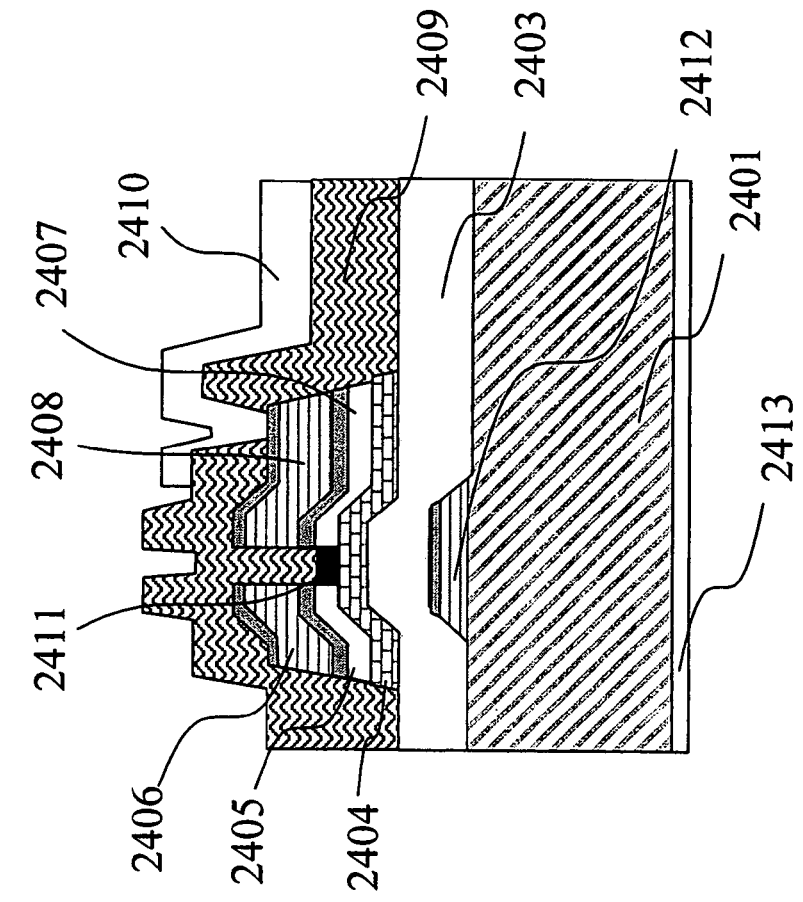
FIG. 24 are sectional views showing a conventional TFT device structure and an improved TFT device structure.
Figure 24:
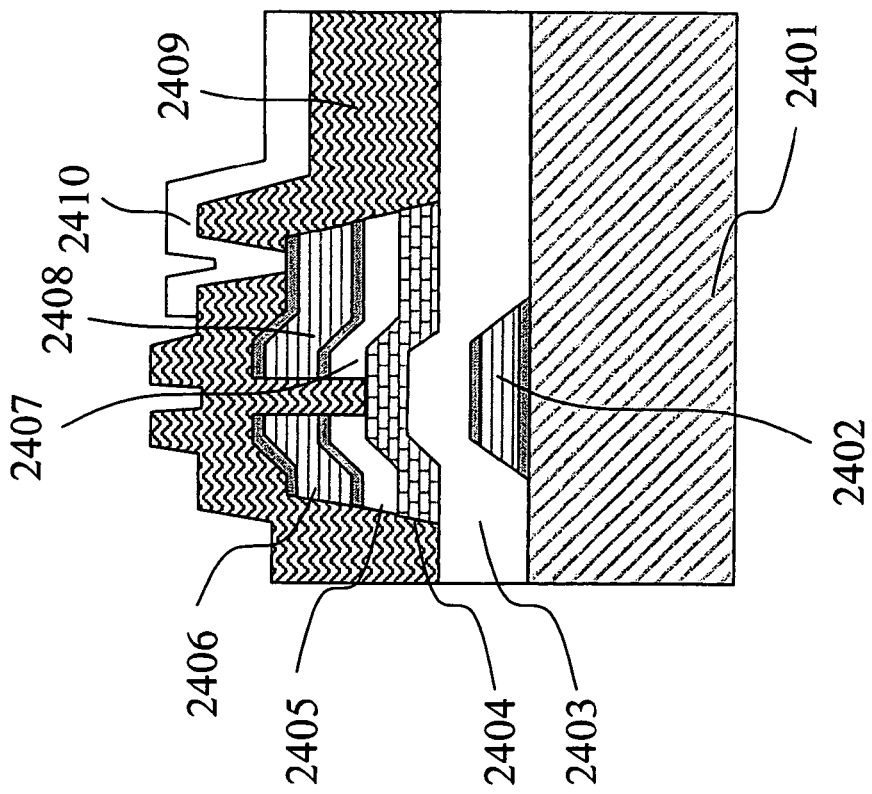

FIG. 24 show a conventional TFT device structure of an inverse-stagger structure and an improved TFT device structure. Here, reference numeral 2401 denotes a glass substrate or a plastic substrate, 2402 does a gate electrode (Ti/Al/Ti), 2403 does a gate insulating film ($Si_3N_4$), 2404 does a channel portion (non-doped amorphous silicon), 2405 does a source (n+ amorphous silicon), 2406 does a source electrode (Ti/Al/Ti), 2407 does a drain (n+ amorphous silicon), 2408 does a drain electrode (Ti/Al/Ti), 2409 does an insulating interlayer ($Si_3N_4$), 2410 does a pixel electrode (ITO), 2411 does a silicon oxide film for insulating source/drain, 2412 does an gate electrode (TaN/Cu), and 2413 does a back-surface transparent electrode (ITO).

On the back surface of the glass substrate of the improved TFT device structure, the ITO film 2413 is formed to improve the close contact between the substrate and the susceptor of the film formation apparatus by an electrostatic chuck, and prevent improvement of reliability/uniformity of process, in particular, device break and deterioration of device characteristics due to static electricity. Although a silicon nitride film is used for the gate insulating film 2403 like the prior art, since considerable improvement of its withstand voltage has succeeded, the thickness of the silicon nitride film can be decreased to the degree of 100 to 200 nm though it conventionally required about 400 nm. By thinning the silicon nitride film to a half, it becomes possible to improve the current drive performance of the TFT device substantially twice.

In the improved TFT device structure, since not the n+ amorphous silicon layer between the source 2405 and the drain 2407 is etched by RIE, but the n+ amorphous silicon layer is directly oxidized with the apparatus of FIG. 23 to insulate, the non-doped amorphous silicon layer 2404 as the channel is never exposed to high-energy ion irradiation. Therefore, the non-doped amorphous silicon layer 2404 can be thinned from 150 nm to about 30 nm. When the thickness of the non-doped amorphous silicon layer 2404 as the channel becomes ⅕, since the resistance of the spatial charge layer becomes about ¹⁄25, the current drive performance of the TFT device becomes 20 to 30 times. Because the thickness of the non-doped amorphous silicon layer 2404 could be decreased to about ⅕ or less, the amount of generated electron-hole pairs by a back light also could be decreased to about ⅕ or less, and the dynamic range of the luminance of the LCD display section can be improved by nearly one figure.

Figure 25:
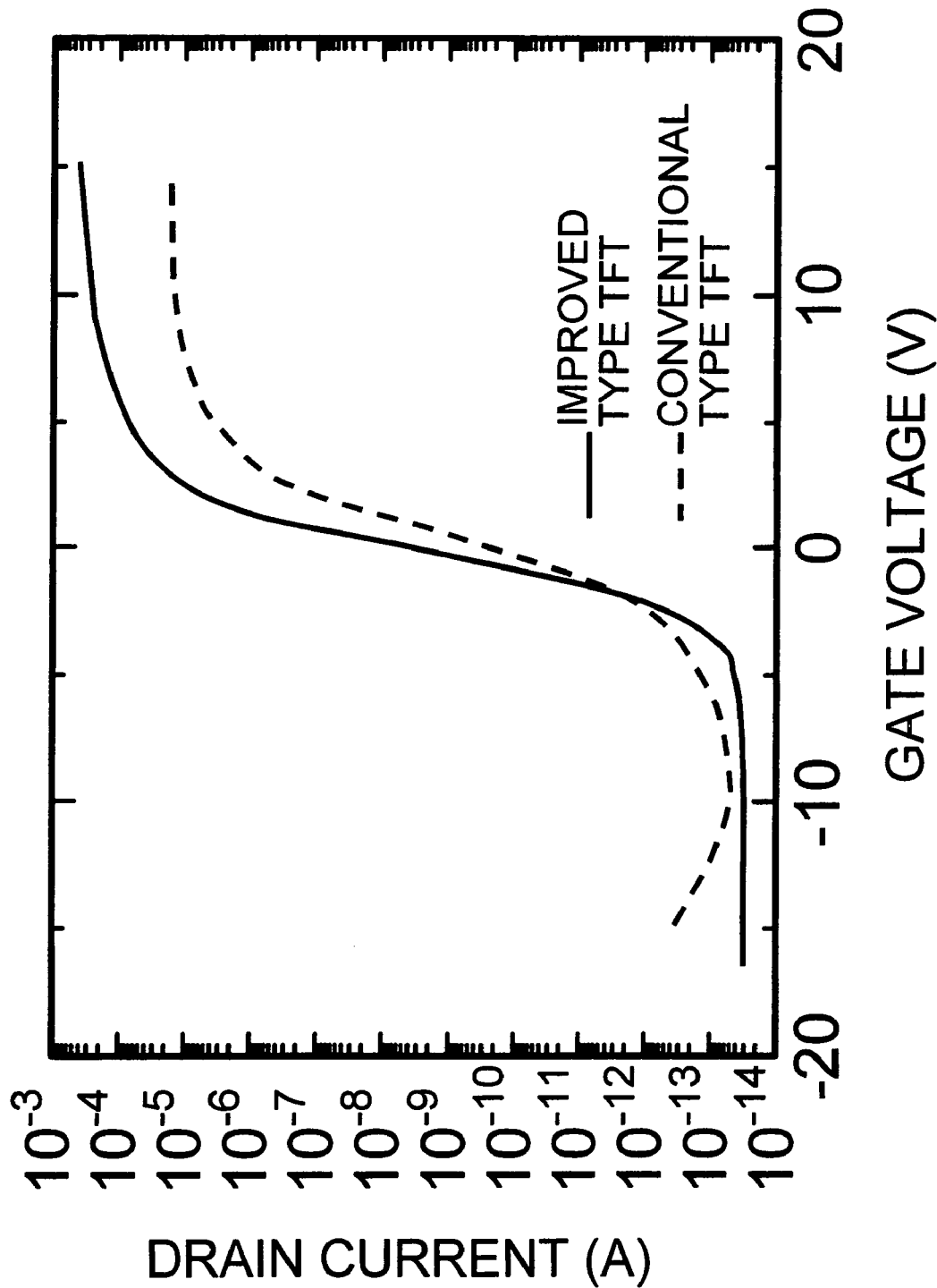
FIG. 25 is a graph showing a result of measurement of the relation between the gate voltage and the drain current of TFT devices.

FIG. 25 shows the relation between the gate voltage and the drain current of TFT devices. In comparison with the conventional TFT device, the drain current of the improved TFT device is considerably increased, and it shows that the characteristic is considerably improved. Simultaneously, the leakage current upon reverse biasing is also decreased. This is because the interface characteristic between the non-doped amorphous silicon and the $SiO_2$ layer is improved.

Embodiment 5

Figure 26:
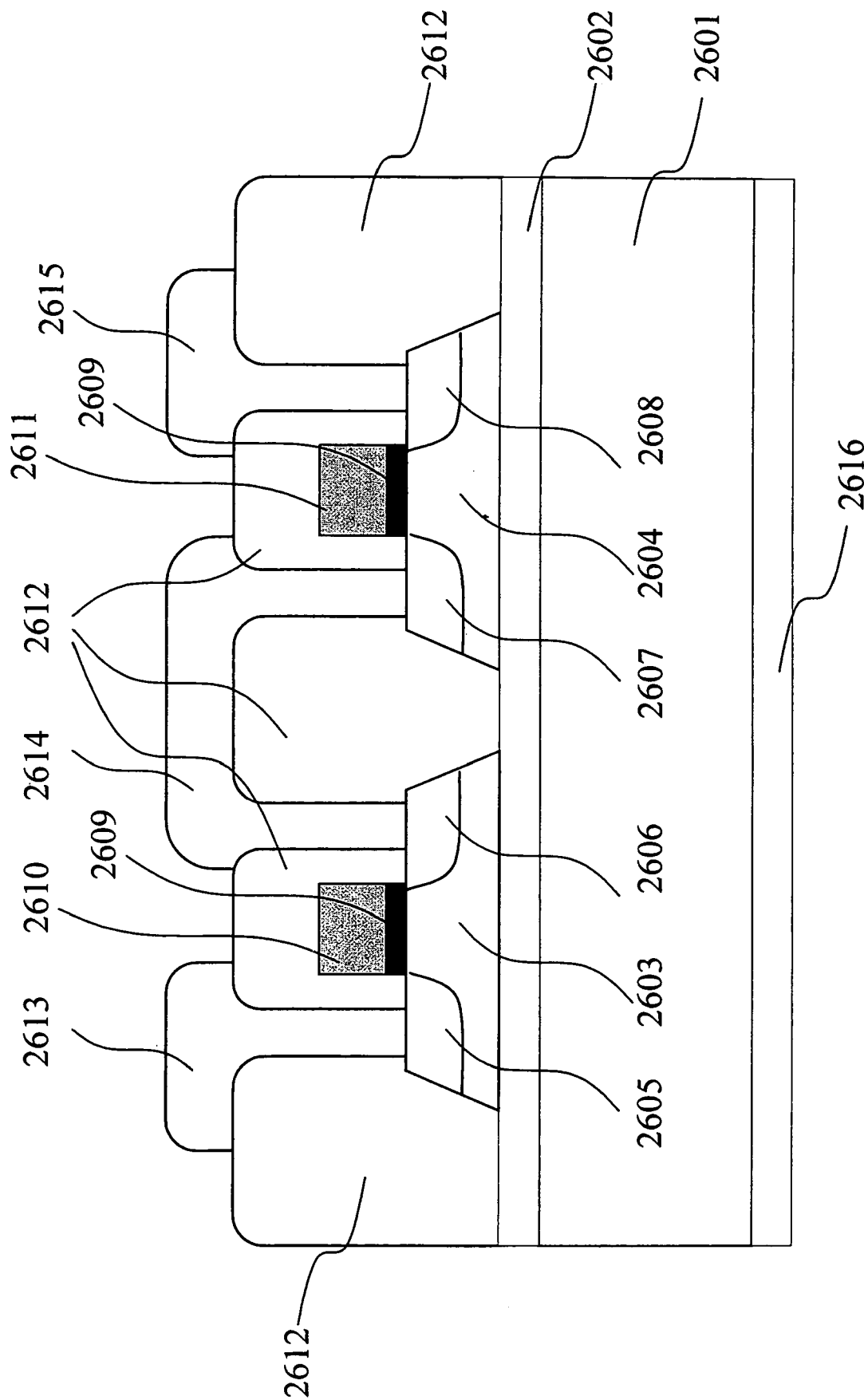
FIG. 26 is a sectional view of polysilicon TFTs for driving a display section such as an LCD.

FIG. 26 shows a sectional structure of polysilicon TFTs made for a peripheral circuit of a display unit such as an LCD. Reference numeral 2601 denotes a glass substrate or a plastic substrate, 2602 does an $Si_3N_4$ film, 2603 does the channel layer of a polysilicon pMOS, 2605 and 2606 do the source region and the drain region of a polysilicon nMOS, respectively, and 2607 and 2608 do the source region and the drain region of the pMOS, respectively. Reference numeral 2609 denotes a $SiO_2$ layer according to the present invention, wherein a uniformly thick silicon oxide film at either of its flat portion and its edge portion is formed on polysilicon. Reference numeral 2610 denotes the gate electrode of the polysilicon nMOS, 2611 does the gate electrode of the polysilicon pMOS, 2612 does an insulating film such as $SiO_2$, BSG, or BPSG, 2613 and 2614 do a source electrode and a drain electrode (simultaneously a drain electrode of the polysilicon PMOS) of the polysilicon nMOS, 2615 does a source electrode of the polysilicon pMOS, and 2616 does a transparent electrode such as surface ITO.

Figure 27:
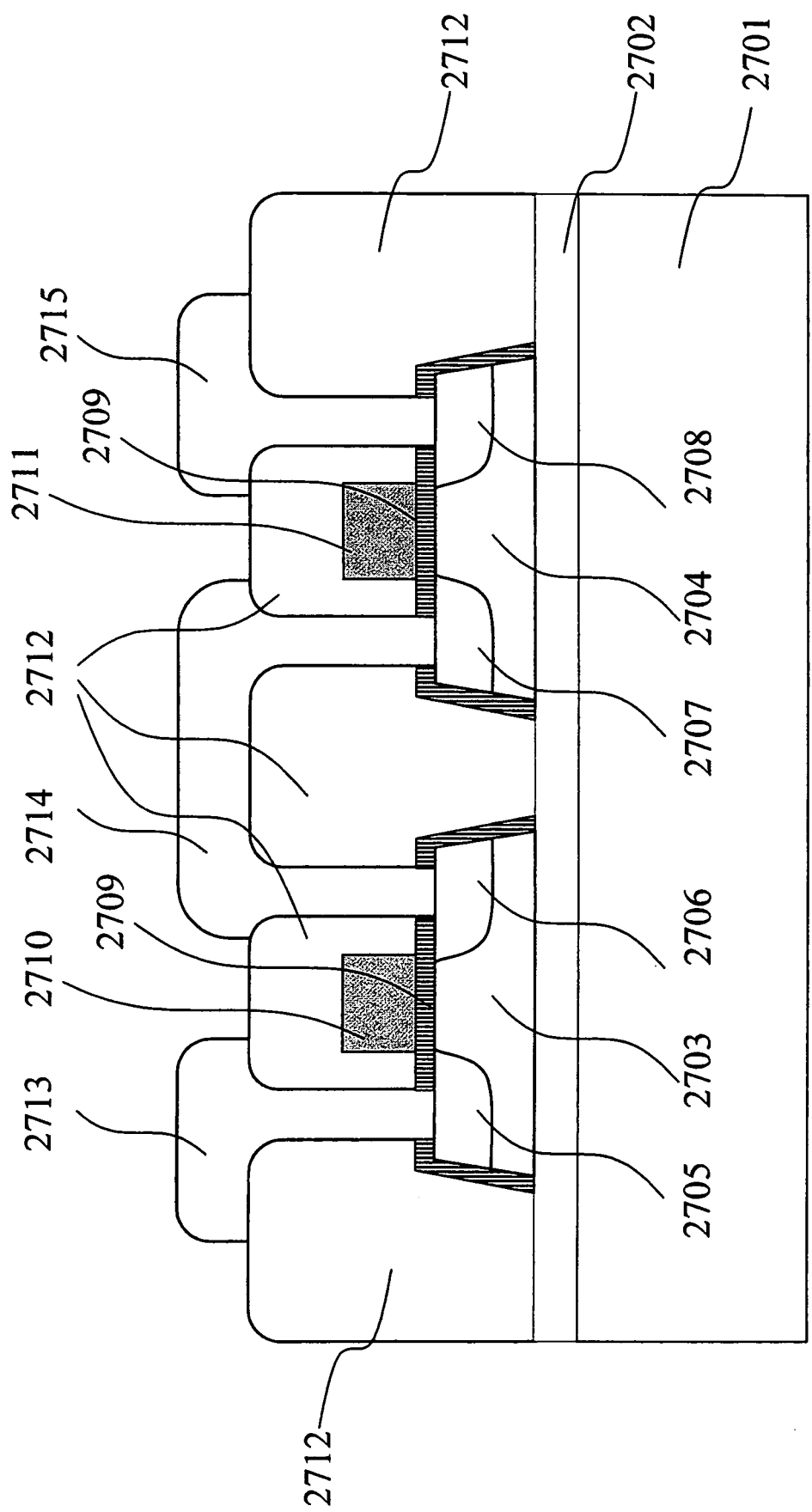
FIG. 27 is a sectional view of polysilicon TFTs for driving a display section such as an LCD.

Besides, the present invention is applied also to polysilicon TFTs made for a peripheral circuit of a display unit such as an LCD, as shown in FIG. 27. Reference numeral 2701 denotes a glass substrate or a plastic substrate, 2702 does an $Si_3N_4$ film, 2703 does the channel layer of a polysilicon pMOS, 2705 and 2706 do the source region and the drain region of a polysilicon nMOS, respectively, and 2707 and 2708 do the source region and the drain region of the pMOS, respectively. Reference numeral 2709 denotes a $SiO_2$ layer according to the present invention, wherein the oxide film is not thinned even at the corners of the element isolating region between the transistors, and a uniformly thick silicon oxide film at either of its flat portion and its edge portion is formed on polysilicon. Therefore, the electrical characteristics/reliability of the device were remarkably improved. Reference numeral 2710 denotes the gate electrode of the polysilicon nMOS, 2711 does the gate electrode of the polysilicon pMOS, 2712 does an insulating film such as $SiO_2$, BSG, or BPSG, 2713 and 2714 do a source electrode and a drain electrode (simultaneously a drain electrode of the polysilicon pMOS) of the polysilicon nMOS, 2715 does a source electrode of the polysilicon PMOS, and 2716 does a transparent electrode such as surface ITO.

Figure 28:
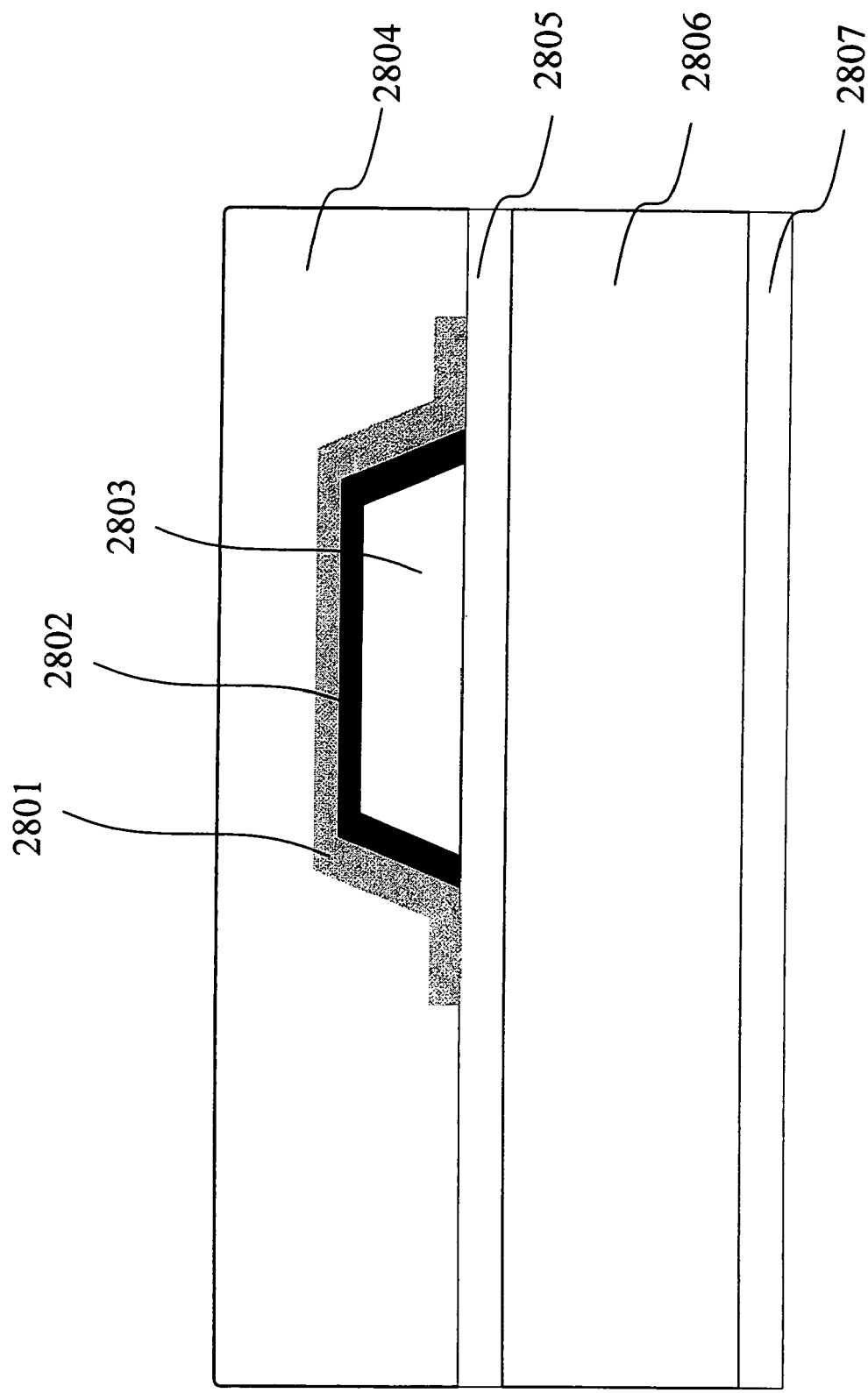
FIG. 28 is another sectional view of a polysilicon TFT for driving a display section such as an LCD.

FIG. 28 is another sectional structure of a polysilicon TFT made for a peripheral circuit of a display unit such as an LCD. Here, reference numeral 2801 denotes a polysilicon electrode, 2802 does a $SiO_2$ layer according to the present invention, 2803 does a polysilicon layer, 2804 does an insulating film such as $SiO_2$, BSG, or BPSG, 2805 does an $Si_3N_4$ film, 2806 does a glass substrate or a plastic substrate, and 2807 does a transparent electrode such as surface ITO.

This structure was made by the manner that the polysilicon layer 2803 was formed on the $Si_3N_4$ film 2805, and, after etching the polysilicon layer 2803, the $SiO_2$ layer 2802 to be a gate insulating film was formed by plasma oxidation using Kr, and further the polysilicon electrode 2801 to be a gate electrode was formed.

In the apparatus shown in FIG. 23, using a two-stage shower plate microwave-excited high density plasma apparatus in which a two-stage shower plate has been further introduced, when inert gas such as Ar, Kr, or Xe is supplied through the first stage shower plate and material gas such as $SiH_4$ is supplied through the second stage shower plate, the electron mobility in polysilicon formed is 200 to 400 $cm^2$/Vsec at a substrate temperature of about 300° C. If the channel length is set at about 1.5 to 2.0 μm, sufficiently high-speed signal processing beyond 100 MHz becomes possible. Most peripheral circuits required for driving a display unit such as an LCD can be made.

INDUSTRIAL APPLICABILITY

According to the present invention, it becomes possible to realize a high-quality silicon oxide film superior to a conventional thermal oxide film formed at a high temperature of about 1000° C., at a low temperature of a substrate temperature of 200 to 500° C.

Besides, since the thickness of the silicon oxide film at a portion near a corner of a silicon oxide film element isolation side wall portion becomes generally equal to the thickness of a flat silicon surface portion, the characteristics such as leakage current and withstand voltage of the oxide film become good, and an improvement of the reliability of the element and an improvement of the drive performance of the MOS transistor can be realized.

Besides, even if the angle of the side wall portion of the recess portion of the element isolating region formed on a silicon substrate, with the silicon surface is set at 70 degrees or more or 90 degrees, thinning of the silicon oxide film at a corner of the side wall portion does not occur, it becomes possible to form a narrow element isolating region, the ratio of an effective area for forming elements such as transistors is increased, and high density integration can be realized.

Further, even in the element isolation structure for integrated elements of SOI (Silicon On Insulator) transistors and polysilicon transistors formed on an insulating film, a high-quality oxide film can be formed on the element isolation side wall portion, and, without any parasitic transistor existing, the electrical characteristics of the transistors can be good. By using the silicon oxide film formation method of the present invention, a very high-quality silicon oxide film can be formed even though it is formed at a low temperature as a substrate temperature of 200 to 500° C. By this, fabrication of high-performance amorphous silicon TFTs or polysilicon TFTs on a metallic substrate SOILSI, a glass substrate, or a plastic substrate which was conventionally impossible becomes possible, so the effect is great.

What is claimed is:

1. A method for forming a silicon oxide film, characterized by introducing a mixture gas mainly containing a gas containing oxygen and Kr gas, and having an oxygen partial pressure of 1% to 7%, into a process chamber, exciting plasma with a microwave within said process chamber, and placing a silicon substrate in said process chamber and converting silicon of said silicon substrate at the surface thereof into silicon oxide, thereby forming a directly oxidized film at the surface of said silicon substrate.

2. The method for forming a silicon oxide film according to claim 1, characterized in that said silicon oxide film is the gate insulating film of a transistor.

3. The method for forming a silicon oxide film according to claim 1, characterized in that said plasma is plasma excited with a microwave of a frequency of 900 MHz to 10 GHz.

4. A method for forming a silicon oxide film, characterized by introducing a mixture gas mainly containing a gas containing oxygen and Kr gas into a process chamber, exciting plasma with a microwave, and placing a silicon substrate in said process chamber and converting silicon of said silicon substrate at the surface thereof into silicon oxide, thereby forming a directly oxidized film at the surface of said silicon substrate, wherein the oxygen partial pressure in said mixture gas is 2 to 4%, and the pressure in said process chamber is 800 mTorr (106 Pa) to 1.2 Torr (160 Pa).

5. A method for forming a semiconductor device, comprising introducing a mixture gas mainly containing a gas containing oxygen and Kr gas, and having an oxygen partial pressure of 1% to 7%, into a process chamber, exciting plasma with a microwave within said process chamber, and placing a silicon substrate in said process chamber and converting silicon of said silicon substrate at the surface thereof into silicon oxide, thereby forming a directly oxidized film at the surface of said silicon substrate, wherein said directly oxidized film is used as a gate insulation film of said semiconductor device.

* * * * *